United States Patent
Cho et al.

(10) Patent No.: US 11,943,001 B2
(45) Date of Patent: *Mar. 26, 2024

(54) ELECTRONIC DEVICE AND WIRELESS COMMUNICATION SYSTEM THEREOF

(71) Applicant: SAMSUNG ELECTRONICS CO., LTD., Suwon-si (KR)

(72) Inventors: Namjun Cho, Suwon-si (KR); Jooseung Kim, Suwon-si (KR); Hyunseok Choi, Suwon-si (KR); Hyoseok Na, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/984,950

(22) Filed: Nov. 10, 2022

(65) Prior Publication Data

US 2023/0082108 A1   Mar. 16, 2023

Related U.S. Application Data

(63) Continuation of application No. 16/934,542, filed on Jul. 21, 2020, now Pat. No. 11,502,760.

(30) Foreign Application Priority Data

Jul. 24, 2019 (KR) .................. 10-2019-0089599

(51) Int. Cl.
*H04B 17/13* (2015.01)
*H04B 17/10* (2015.01)
*H04W 4/38* (2018.01)

(52) U.S. Cl.
CPC ........... *H04B 17/13* (2015.01); *H04B 17/102* (2015.01); *H04W 4/38* (2018.02)

(58) Field of Classification Search
CPC ........ H04B 17/13; H04B 17/102; H04B 1/40; H04B 1/04; H04B 2001/0425;
(Continued)

(56) References Cited

U.S. PATENT DOCUMENTS 6,385,262 B1   5/2002 Gustafsson et al.
6,781,951 B1   8/2004 Fifield
(Continued)

FOREIGN PATENT DOCUMENTS

CN   1283372 A   2/2001
CN   101247153   8/2008
(Continued)

OTHER PUBLICATIONS

Communication dated Oct. 31, 2022, issued by the China National Intellectual Property Administration in Chinese Application No. 202010675530.1.

(Continued)

*Primary Examiner* — Christopher M Brandt
(74) *Attorney, Agent, or Firm* — Sughrue Mion, PLLC

(57) ABSTRACT

An electronic device includes a network monitor configured to acquire network environment information related to a radio frequency (RF) transmission signal; a transceiver configured to generate an envelope signal of the RF transmission signal; a transmission (Tx) module including a power amplifier for receiving the RF transmission signal from the transceiver and amplifying the RF transmission signal; and an envelope tracking (ET) modulator configured to receive the envelope signal from the transceiver and to provide a bias of a power amplifier to correspond to the envelope signal, wherein the ET modulator determines a magnitude of the bias of the power amplifier based on the network environment information acquired by the network monitor.

20 Claims, 23 Drawing Sheets

(58) Field of Classification Search
CPC .. H04W 4/38; H03F 2200/18; H03F 2200/27; H03F 2203/21127; H03F 1/42; H03F 3/19; H03F 3/21; H03F 3/265; H03F 2200/102; H03F 1/0227; H03G 3/007

See application file for complete search history.

(56) References Cited

U.S. PATENT DOCUMENTS

| | | | |
|---|---|---|---|
| 9,748,845 | B1 | 8/2017 | Kotikalapoodi |
| 9,880,802 | B2 | 1/2018 | Satoskar et al. |
| 10,079,576 | B2 | 9/2018 | Wimpenny |
| 10,511,271 | B2 | 12/2019 | Kim et al. |
| 2007/0140376 | A1 | 6/2007 | Kang |
| 2010/0020895 | A1 | 1/2010 | Jiang et al. |
| 2010/0328127 | A1 | 12/2010 | Sampath et al. |
| 2012/0051407 | A1 | 3/2012 | Ji et al. |
| 2012/0056677 | A1 | 3/2012 | Zhu et al. |
| 2012/0069931 | A1 | 3/2012 | Gandhi et al. |
| 2013/0077713 | A1 | 3/2013 | Kim et al. |
| 2013/0114762 | A1 | 5/2013 | Azadet et al. |
| 2014/0028370 | A1 | 1/2014 | Wimpenny |
| 2014/0241462 | A1 | 8/2014 | Bellaouar et al. |
| 2014/0328431 | A1 | 11/2014 | Haddad et al. |
| 2015/0031318 | A1 | 1/2015 | McCallister |
| 2015/0098523 | A1 | 4/2015 | Lim et al. |
| 2015/0188432 | A1 | 7/2015 | Vannorsdel et al. |
| 2015/0333781 | A1 | 11/2015 | Alon et al. |
| 2016/0285484 | A1 | 9/2016 | Weissman et al. |
| 2018/0034416 | A1 | 2/2018 | Duncan et al. |
| 2018/0076772 | A1 | 3/2018 | Khesbak et al. |
| 2020/0204116 | A1 | 6/2020 | Khlat |

FOREIGN PATENT DOCUMENTS

| | | |
|---|---|---|
| CN | 102916923 A | 2/2013 |
| CN | 103858337 A | 6/2014 |
| CN | 104113285 | 10/2014 |
| CN | 105811893 | 7/2016 |
| CN | 107743105 A | 2/2018 |
| KR | 10-2007-0065984 A | 6/2007 |
| KR | 1020150040088 | 4/2015 |
| KR | 10-1681048 | 12/2016 |
| KR | 1020160149886 | 12/2016 |
| KR | 10-2018-0081317 A | 7/2018 |
| WO | 2013/063443 A1 | 5/2013 |
| WO | 2015/184174 A1 | 12/2015 |

OTHER PUBLICATIONS

Notice of Allowance issued in parent U.S. Appl. No. 16/934,542 dated Jul. 18, 2022.

Office Action issued in parent U.S. Appl. No. 16/934,542 dated Mar. 15, 2022.

Kun-Da Wu et al., "A New Wide-Bandwidth Hybrid Supply Modulator for LTE-A Power Amplifiers", International Conference on Applied System Innoation (ICASI), May 17, 2017, 4 pgs.

Chinese Office Action dated Sep. 3, 2021 issued in counterpart application No. 202010675530.1, 25 pages.

European Search Report dated Sep. 22, 2021 issued in counterpart application No. 20186701.7-1203, 5 pages.

Kun-Da Wu et al., "A New Wide-Bandwidth Hybrid Supply Modulator for LTE-A Power Amplifiers", XP033127969, Proceedings of the 2017 IEEE International Conference on Applied System Innovation IEEE-ICASI 2017, May 13, 2017, 4 pages.

International Search Report dated Oct. 15, 2020 issued in counterprt application No. PCT/KR2020/009433, 3 pages.

European Search Report dated Nov. 6, 2020 issued in counterpart application No. 20186701.7-1203, 9 pages.

Li, Zhi-qiang et al., "Envelope Tracking System Performance Test based on Vector Signal Generator and Signal & Spectrum Analyzer", China Integrated Circuit, Issue 5, May 5, 2017, pp. 66-69.

Communication dated Apr. 14, 2023 by the European Patent Office in European Patent Application No. 20186701.7.

Communication dated Apr. 22, 2023 by the National Intellectual Property Administration of PR China in Chinese Patent Application No. 202010675530.1.

Communication dated Nov. 14, 2023 by the Korean Patent Office in Korean Patent Application No. 10-2019-0089599.

Communication dated Jan. 22, 2024 by the European Patent Office in European Patent Application No. 23199538.2.

ELECTRONIC DEVICE AND WIRELESS COMMUNICATION SYSTEM THEREOF

CROSS-REFERENCE TO RELATED APPLICATION(S)

This application is a continuation of U.S. application Ser. No. 16/934,542 filed Jul. 21, 2020, which is based on and claims priority under 35 U.S.C. § 119 to Korean Patent Application No. 10-2019-0089599, filed on Jul. 24, 2019, in the Korean Intellectual Property Office, the disclosures of which are incorporated by reference herein in their entirety.

BACKGROUND

1. Field

The disclosure relates generally to an electronic device, and more particularly, to an electronic device including a radio frequency (RF)-based wireless communication system.

2. Description of Related Art

A portable electronic device may have a wireless communication function to provide various functions to a user. A wireless communication system included in the electronic device has been developed to support a higher data rate in order to meet the ever-increasing data traffic demand. Various technologies such as envelope tracking (ET), digital pre-distortion (DPD), or crest factor reduction (CFR) are used to improve the overall efficiency of a wireless communication system such as high data rate and power consumption.

In the currently developed fifth generation (5G) network environment, a higher bandwidth than a commercialized network is used, and signals of a legacy network and a 5G network may be configured and used in combination. Accordingly, signals with a wider range of bandwidths may be used in a 5G network environment compared to a conventional wireless communication system.

Since a conventional wireless communication system does not require a high bandwidth, limited parameters have been used when implementing ET, DPD, or CFR. However, in the 50 network environment, higher bandwidth scenarios should be considered, and therefore it may be advantageous to introduce parameters that are adapted to the network environment based on power consumption and system stabilization.

SUMMARY

The present disclosure has been made to address the above-mentioned problems and disadvantages, and to provide at least the advantages described below.

In accordance with an aspect of the disclosure, an electronic device includes a network monitor configured to acquire network environment information related to an RF transmission signal; a transceiver configured to generate an envelope signal of the RF transmission signal; a transmission (Tx) module including a power amplifier for receiving the RF transmission signal from the transceiver and amplifying the RF transmission signal; and an ET modulator configured to receive the envelope signal from the transceiver and to provide a bias of a power amplifier to correspond to the envelope signal, wherein the ET modulator determines a magnitude of the bias of the power amplifier based on the network environment information acquired by the network monitor.

In accordance with another aspect of the disclosure, a control method of a wireless communication system of an electronic device includes acquiring network environment information related to an RF transmission signal; generating an envelope signal of the RF transmission signal; and providing a bias of a power amplifier for amplifying the RF transmission signal to correspond to the envelope signal, wherein providing the bias includes determining a magnitude of the bias of the power amplifier based on the network environment information.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Various embodiments of the disclosure provide a wireless communication system which is adapted to a network environment to support high efficiency and stability, and an electronic device having the same.

According to various embodiments of the disclosure, it is possible to provide a wireless communication system which can monitor a network environment in real time and optimize its performance using parameters adapted to the network environment and an electronic device having the same.

Figure 1:
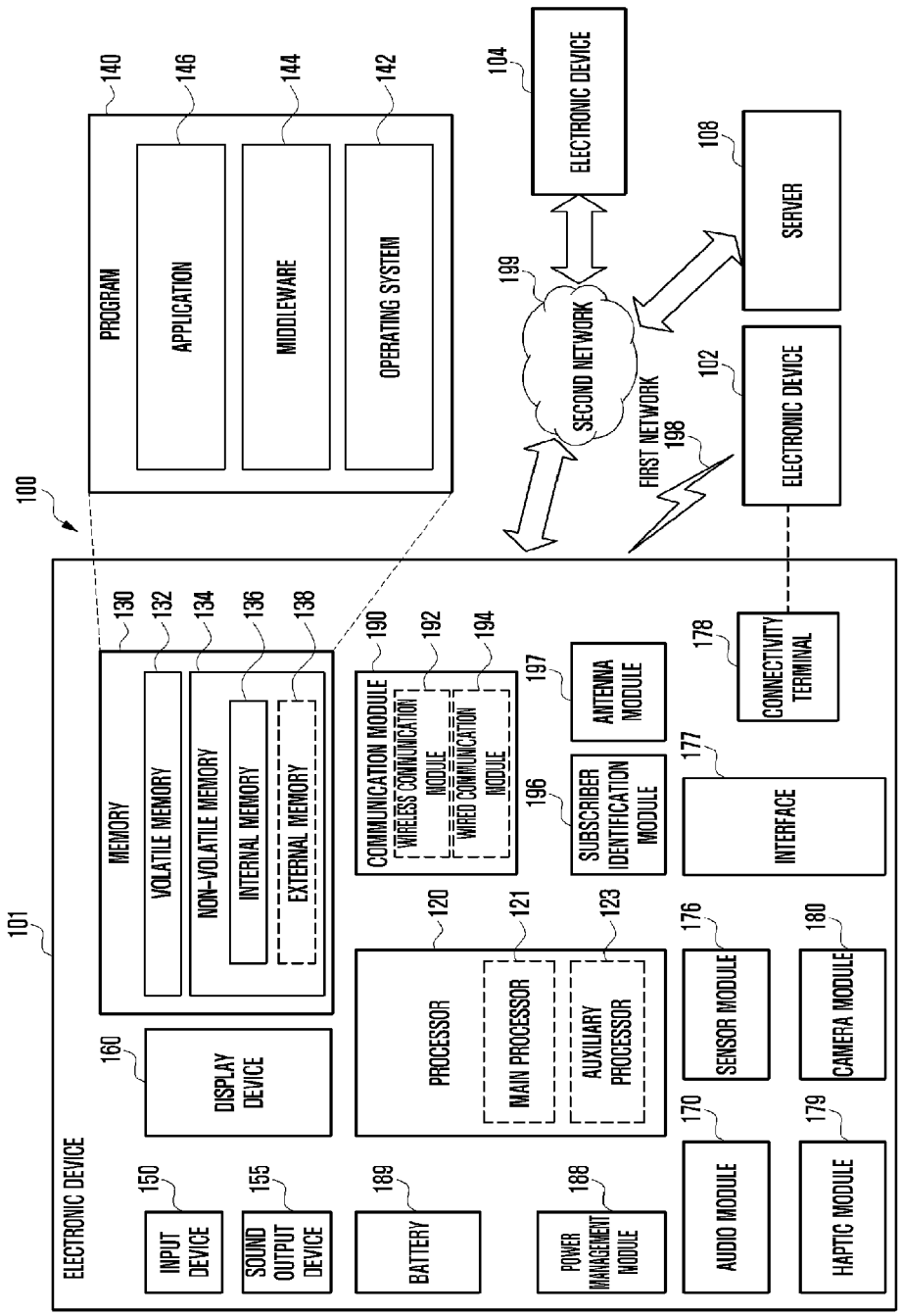
FIG. 1 is a diagram illustrating an electronic device in a network environment, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101.

According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (OPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
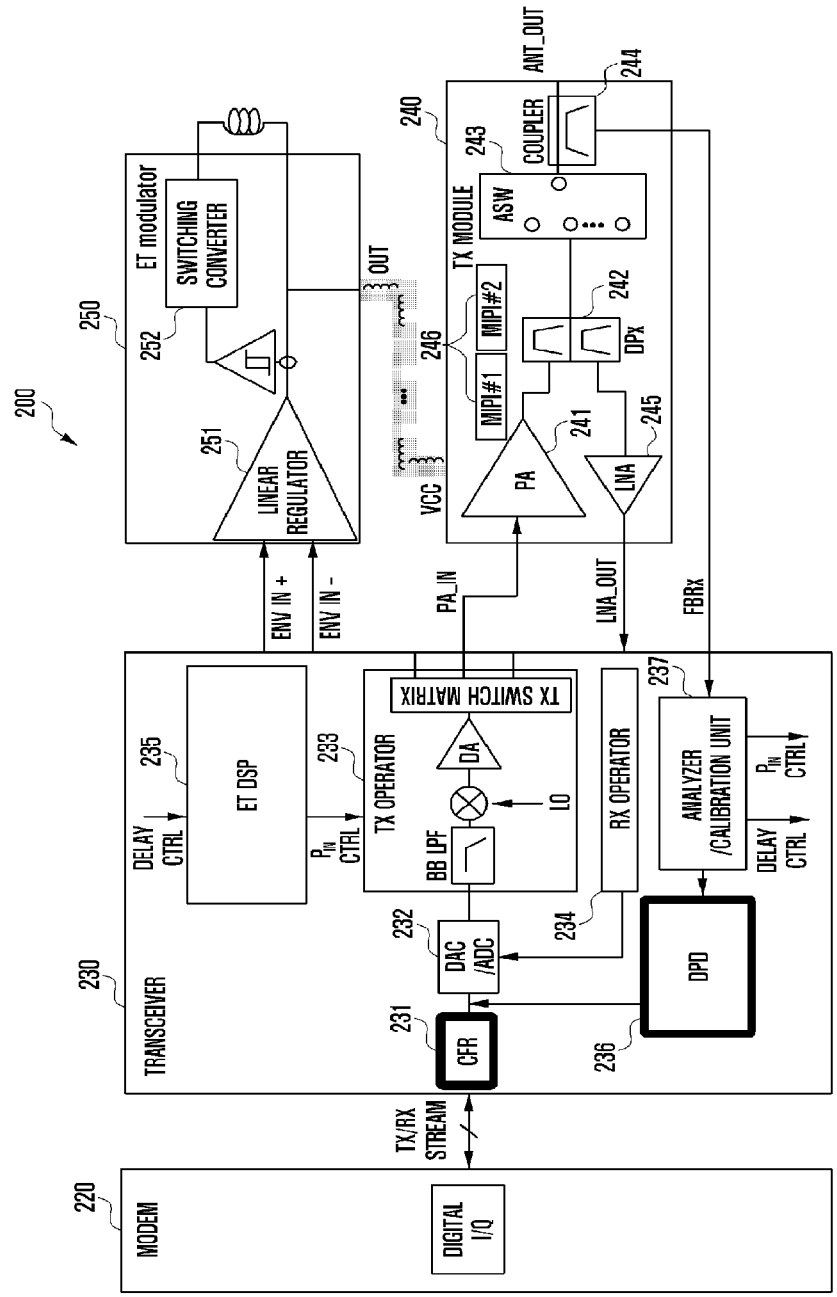
FIG. 2 is a block diagram illustrating a wireless communication system, according to an embodiment.

FIG. 2 is a block diagram illustrating a wireless communication system, according to an embodiment.

The wireless communication system 200 may constitute at least a portion of a wireless communication module 192 of an electronic device 101.

Referring to PG. 2, the wireless communication system 200 includes a modem 220, a transceiver 230, a Tx module 240, and an ET modulator 250. The illustrated components may only show some components that form a Tx path in the wireless communication system 200, and various components not shown may be further included. The wireless communication system 200 may further include various components for processing an RF reception signal received from an antenna.

The wireless communication system 200 of FIG. 2 may perform ET, DPD, or CFR for an RF transmission signal, but may not include a network monitor 360 that monitors network environment information.

The modem 220 may perform modulation and demodulation of signals in the wireless communication system 200. The modem 220 may use various modulation and demodulation schemes such as a phase shift keying (PSK) method such as binary PSK (BPSK) or quadrature PSK (QPSK), and a quadrature amplitude modulation (QAM) method such as 64-QAM or 256-QAM. Various modulation and demodulation schemes are not limited to the above examples.

The modem 220 may transmit and receive in phase and in quadrature (I/Q) signals of a digital baseband to and from the transceiver 230 using each channel.

The transceiver 230 may perform digital/analog conversion based on the signals transmitted from the modem 220, may up/down-convert a baseband signal into an RF signal, and may transmit and receive an RF signal to and from an RF front end module.

Referring to FIG. 2, the transceiver 230 includes a CFR block 231, a digital to analog converter (DAC)/analog to digital converter (ADC) block 232, a Tx operator 233, an Rx operator 234, an envelope tracking digital signal processor (ET DSP) 235, a digital pre-distortion (DPD) block 236, and an analyzer/calibration block 237.

The analyzer/calibration block 237 may check an output power of a Tx signal to adjust the Tx signal. The analyzer/calibration block 237 may acquire information related to the output power of the Tx signal in real time from the Tx module 240 through an FBRx path.

The CPR block 231 may perform CFR on the input/output (I/O) signal of the digital baseband transmitted from the modem 220 for the purpose of controlling high power, high efficiency, and high linearity of a power amplifier (PA) 241 of the Tx module 240. The CFR is a technique used to reduce a peak to average power ratio (PAPR) of the PA, and will be described later in more detail through FIG. 16.

The DAC/ADC block 232 may convert a CFR processed signal into an analog signal and may convert a reception signal received from an external device through an antenna into a digital signal. In FIG. 2, the DAC/ADC is shown as one block 232, but the independent DAC block and ADC block may be arranged in a Tx path and an Rx path, respectively.

The Tx operator 233 may process an analog transmission signal processed by the DAC/ADC block 232 to transmit the processed analog transmission signal to the Tx module 240.

The Rx operator 234 may process an analog reception signal received through an antenna to transmit the processed analog reception signal to the modem 220 through the DAC/ADC block 232.

The ET DSP 235 may generate and process an envelope signal input to the ET modulator 250. For example, the ET DSP 235 may generate the envelope signal of the RF signal, may adjust the type of the envelope signal, and/or may adjust a delay.

The DPD block may perform DPD to compensate for signal compression when an ET technology is applied. The DPD block 236 may perform pre-distortion before an I/Q signal is applied to the Tx module 240 by using a coefficient of a stored DPD lookup table (LUT). The I/Q signal input from the modem 220 to the transceiver 230 may be converted into a digital signal after CFR and DPD are applied. The DPD will be described later in more detail with reference to FIGS. 13 to 15.

In FIG. 2 and the above description, the DAC/ADC block 232, the CFR block 231, and the DPD block 236 are described as being included in the transceiver 230, but according to various embodiments, some of the DAC/ADC block 232, the CFR block 231, or the DPD block 236 may be included in the modem 220. In this case, the modem 220 may convert the I/Q signal into a digital signal after DPD and CFR processing is performed on the I/Q signal, and may transmit the obtained digital signal to the transceiver 230.

The ET modulator 250 may receive the envelope signal generated from the transmitted RF signal from the transceiver 230, and may amplify the envelope signal to apply the amplified signal as the input power of the power amplifier of the Tx module 240. The ET modulator 250 may include a linear regulator 251 and a switching converter 252. The linear regulator 251 may linearly amplify the envelope signal through a sourcing/sinking process. The switching converter 252 may output a switching current which is a DC.

The ET technology using the ET modulator 250 may reduce the current consumption of the wireless communication system 200, and details of the ET technology and the configuration of the ET modulator 250 will be described in more detail with reference to FIGS. 4 to 10.

The Tx module 240 is a module for amplifying and transmitting an RF signal to an antenna. Referring to FIG. 2, the Tx module 240 may include a PA 241 that amplifies a signal input from the transceiver 230 (or the Tx operator 233), a duplexer 242 that filters a Tx signal and an Rx signal, respectively, an antenna switching module 243 that selects each band signal, a coupler 244 that couples a transmitted Tx signal to transmit the coupled Tx signal to the transceiver 230 through an FBRx path, a low noise amplifier (LNA) 245 that amplifies a reception signal applied to the antenna to transmit the amplified signal to the transceiver 230, and at least one mobile industry processor interface (MIPI) controller 246 that adjusts respective sub blocks.

The RF signal amplified by the Tx module 240 may be transmitted to an external device (e.g., a base station) through the antenna.

Figure 3:
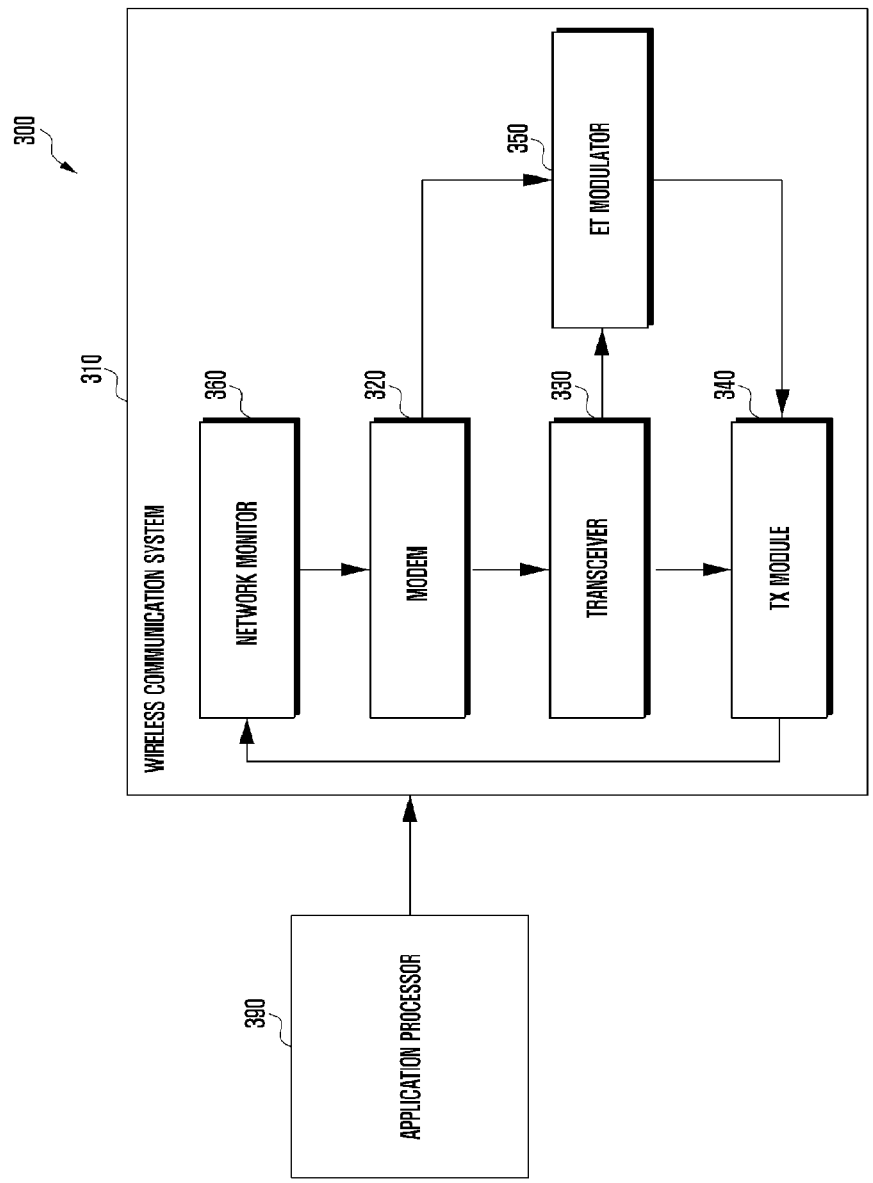
FIG. 3 is a block diagram illustrating an electronic device, according to various embodiments.

FIG. 3 is a block diagram illustrating an electronic device, according to an embodiment.

Referring to FIG. 3, an electronic device 300 includes a wireless communication system 310 and an AP 390.

The electronic device 300 may be a portable electronic device having a wireless communication function such as a smart phone or a tablet personal computer (PC), and may include at least some of the components and/or functions of the electronic device 101 of FIG. 1.

The AP 390 may be configured to control the respective components of the electronic device 300 and/or perform communication-related operations and data processing, and may include at least some of the components and/or functions of the processor 120 of FIG. 1. The AP 390 may be operatively, electrically, and/or functionally connected to the internal components of the electronic device 300, such as the modem 320, the transceiver 330, or the network monitor 360 of the wireless communication system 310.

The AP 390 may execute instructions including control commands such as various arithmetic and logical operations, data movement, or input/output stored in a memory 130.

The operation and data processing functions that can be implemented in the electronic device 300 by the AP 390 are not limited, but in this application, a function for checking a network environment in real time and optimizing power consumption and data rate consumed by the wireless communication system 310 by adjusting various parameters used in the wireless communication system 310 based on the chocked network environment will be described.

The wireless communication system 310 may include a modem 320, a transceiver 330, a Tx module 340, an ET modulator 350, and a network monitor 360. The wireless communication system 310 may support at least one of various wireless communication protocols such as fourth generation (4G) communication (or long term evolution (LTE)) or 5G communication (or new radio (NR)).

The network monitor 360 may check the network environment while the wireless communication system 310 performs wireless communication with an external device (e.g., a base station). In a case where the electronic device 300 is powered on, when a data transmission event occurs or according to a predetermined period, the AP 390 may allow the network monitor 360 to check the network environment and to provide the checked information to the AP 390 and/or other modules in the wireless communication system 310 (e.g., the CFR module, the sampling rate control block, the DPD block, and the ET control block). The network monitor 360 may check network environment information through an FBRx path and/or an Rx path (or Rx chain). The Rx path (or Rx chain) is a path for performing processing, such as demodulation or ADC, on an RF reception signal received from the external device at an antenna, and may check a variety of network environment information used for the RF signal received through the Rx path (or Rx chain). The network monitor 360 may be configured as an independent block, but may also be provided on the modem 320 or the AP 390.

The network environment information may include at least one of a bandwidth, a resource block, a sub-carrier spacing (SCS), or a modulation code and scheme.

More specifically, the bandwidth is the bandwidth of the RF signal to be transmitted, and the wireless communication system 310 may communicate with a base station using some bandwidths determined in the base station and/or a CP among determined bandwidths (e.g., 20 megahertz (MHz) for long team evaluation (LTE) and 100 MHz for NR). The network monitor 360 may check the bandwidth currently used for wireless communication.

The resource block is a unit of resources allocated based on frequency and time in orthogonal frequency-division multiplexing (OFDM), and the wireless communication system 310 may perform wireless communication using some resource blocks determined in the base station and/or the CP (e.g., the auxiliary processor 123 of FIG. 1) among the entire resource block (e.g., 12 subcarriers*7 symbols). The network monitor 360 may check the resource block currently used for wireless communication.

The SCS is a bandwidth spacing of used sub-carriers, and may use a fixed SCS for each network (e.g., 15 kilohertz (KHz) for LTE) or a variable SCS (e.g., 15/30/60 KHz for NR). The network monitor 360 may check the SCS currently used for wireless communication.

The modulation scheme is a scheme for modulating a signal such as QPSK, 160-QAM, 64-QAM, or 256-QAM, and the wireless communication system 310 may support various modulation schemes according to a wireless network situation. The network monitor 360 may check the modulation scheme currently used for wireless communication.

Bach of the modem 320, the transceiver 330, the Tx module 340, and the ET modulator 350 may include at least some components and/or functions of the modem 220, the transceiver 230, the Tx module 240, and the ET modulator 250, and may further include at least one component and/or function for controlling each function based on the network environment information obtained from the network monitor 360 in addition to the components and/or functions described in FIG. 2.

The wireless communication system 310 may control the ET modulator 350, adjust a sampling rate, adjust a DPD order, apply a DPD coefficient in real time, or determine clipping of a CFR, based on the network environment information obtained from the network monitor 360.

The ET modulator 350 may adjust a drive stage in the linear regulator based on the network environment information (e.g., a modulation scheme, a bandwidth, a resource block, or an SCS) to determine a bias and a pass current $I_{shoot-through}$. This will be described later in more detail with reference to FIGS. 4 to 10.

The sampling rate control block may remove image/harmonic signals by adjusting a sampling frequency of a multiplier in the sampling rate control block and adjusting a cutoff frequency of a baseband (BB) low pass filter (LPF) based on the network environment information, thereby determining the sampling rate. This will be described later in more detail with reference to FIOS. 11 to 12.

The DPD block 236 may determine an appropriate coefficient in a DPD LUT based on the network environment information, and may perform DPD in real time using the determined coefficient. This will be described later in more detail with reference to FIGS. 13 to IS.

The CFR control block 231 may adjust a clipping level during CFR by adjusting an Xmax variable and a weighting coefficient (p[n]) based on the network environment information. This will be described later in more detail with reference to FIG. 16.

The electronic device 300 may include only some components and/or functions among the above-described ET modulator 350, sampling rate control block, DPD block 236, or CFR control block 231.

Figure 4:
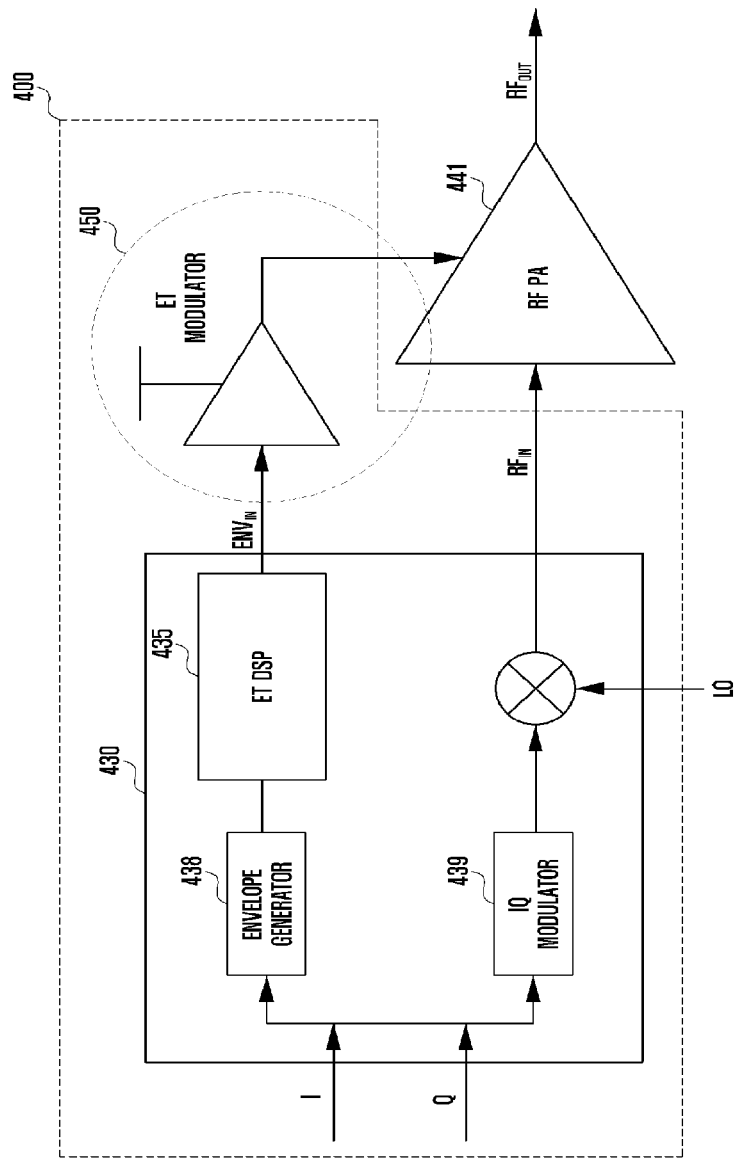
FIG. 4 is a block diagram illustrating an ET system, according to an embodiment.

FIG. 4 is a block diagram illustrating an ET system, according to an embodiment.

FIG. 4 shows an ET system 400 and a power amplifier 441 for implementing ET in a wireless communication system 200.

In order to support a high data rate in a wireless network such as a 5G NR, the bandwidth of a corresponding signal is widened and the modulation method of the signal is complicated, so that a peak to average power ratio (PAPR) can be increased. Accordingly, a power amplifier 441 of a Tx module 240 that consumes a large amount of power in the wireless communication system is required to have high efficiency and high linearity. The ET technology can be applied to signals requiring broadband and high PAPR.

Referring to FIG. 4, a digital I/Q signal is input to a transceiver 430 through each channel from a modem 220 of the ET system 400, and the I/Q signal may be input to an envelope generator 438 and an IQ modulator 439.

The I/Q signal modulated by the IQ modulator 439 may be mixed with a local oscillator (LO) signal and may be transmitted to the power amplifier 441 of the Tx module.

The envelope generator 438 may generate an envelope signal from the I/Q signal. The envelope signal may include maximum values of a predetermined period of the I/Q signal. The ET DSP 435 may adjust the type of the generated envelope signal, may perform signal processing such as delay adjustment on the envelope signal, and then may output the obtained signal to the ET modulator 450.

The ET modulator 450 may apply the input envelope signal as an input power of the power amplifier 441 of the Tx module. Accordingly, the power amplifier 441 does not use fixed voltage input power but uses an envelope signal of an input signal ($RF_{IN}$) applied to the power amplifier 441 as the input power, so that power consumed by the power amplifier 441 may be reduced.

Figure 5:
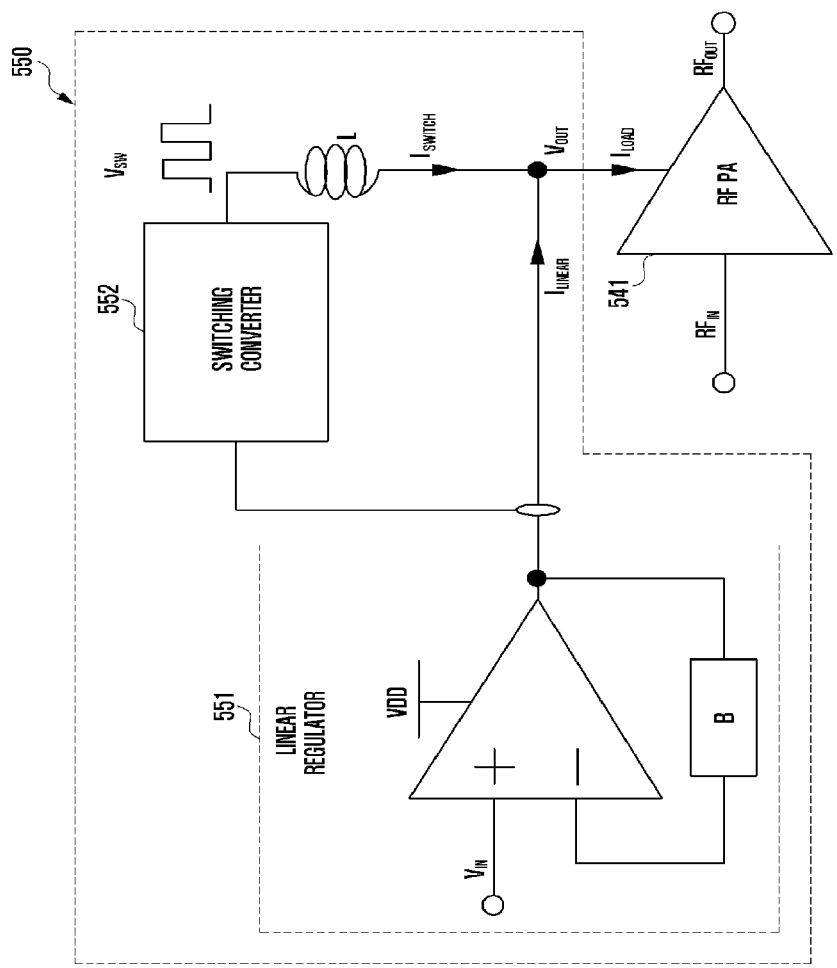
FIG. 5 is a block diagram illustrating an ET modulator and a power amplifier of a Tx module, according to an embodiment.

FIG. 5 is a block diagram illustrating an ET modulator and a power amplifier of a Tx module, according to an embodiment.

Referring to FIG. 5, the ET modulator 550 includes a linear regulator 551 and a switching converter 552. The linear regulator 551 may linearly amplify an envelope signal through a sourcing/sinking process. The switching converter 552 may output a switching current that is a DC current according to a switching frequency.

The linear regulator 551 may be a low drop-out (LDO) regulator that operates at a high speed but has a low efficiency, or may be a switching mode power supply (SMPS) DC-DC converter that operates at a low speed but has a high efficiency.

The ET modulator 550 may have a hybrid structure that includes the linear regulator 551 and the switching converter 552, and may track an envelope signal of a wide bandwidth while amplifying the envelope signal with high efficiency.

Figure 6A:
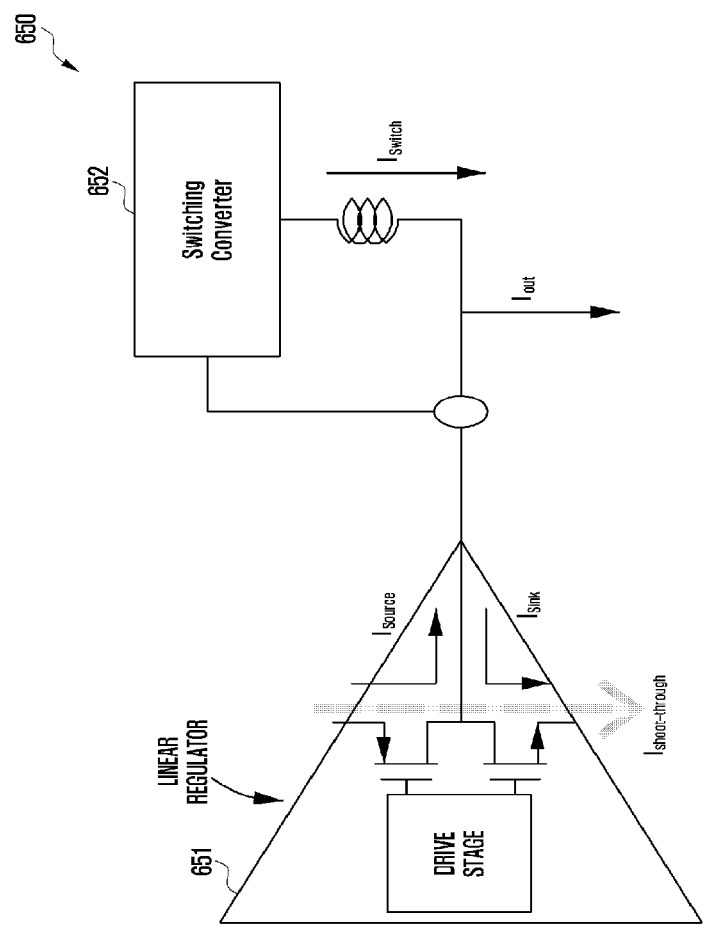
FIG. 6A is a block diagram illustrating an ET modulator, according to an embodiment.
Figure 6B:
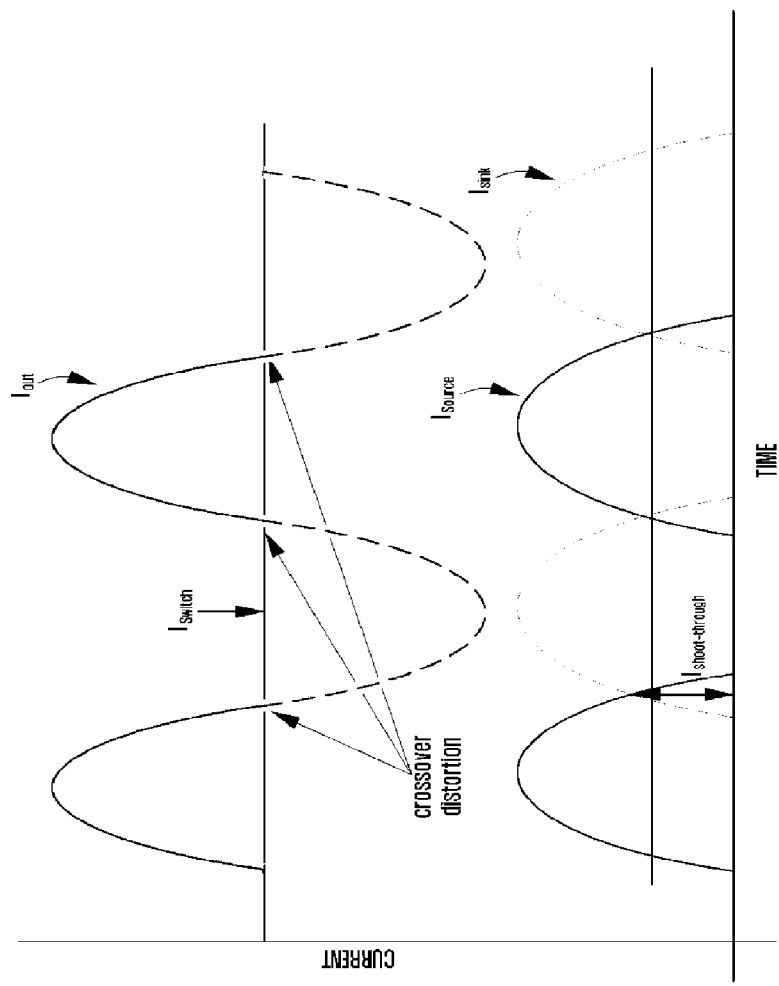
FIG. 6B is a diagram illustrating current waveforms in an ET modulator, according to an embodiment.

FIG. 6A is a block diagram illustrating an ET modulator, according to an embodiment FIG. 6B is a diagram illustrating current waveforms in an ET modulator 650, according to an embodiment.

Referring to FIG. 6A, the ET modulator 650 includes a hybrid, structure that includes a linear regulator 651 and a switching converter 652.

Referring to FIG. 2, an input power Vcc of a power amplifier 241 of a Tx module 240 may be generated according to an output current $I_{out}$ of the ET modulator 650, and an output current $I_{out}$ may be output according to a source current $I_{source}$ and a sink current $I_{sink}$ of the linear regulator 651 and a switch current $I_{switch}$ of the switching converter 652. More specifically, the switching converter 652 may generate the switch current $I_{switch}$ that is a direct current (DC) to output the generated switch current at a predetermined switching frequency through a coil, and the output current $I_{out}$ may be generated through the sourcing/sinking process of the linear regulator 651.

In FIG. 6A, the linear regulator 651 may use a fixed bias. The bias of the linear regulator 651 may be a bias voltage input to a buffer of the linear regulator 651.

In the sourcing/sinking process of the linear regulator 651, crossover distortion noise may occur as two transistors operate alternately. Referring to the graph of FIG. 6B, the crossover distortion noise may occur in a crossing section between a source current and a sink current.

A pass current $I_{shoot-through}$ may be required to reduce this crossover distortion noise, and the magnitude of the pass current $I_{shoot-through}$ may be determined by the bias condition of the linear regulator 651. To reduce the crossover distortion noise, the bias may be increased (class-A direction) to increase the pass current, but in this case, power efficiency may be lowered. Conversely, when the bias current is reduced (class-B direction) in consideration of power efficiency to reduce the pass current, a problem of crossover distortion noise may occur. Therefore, in order to optimize the crossover distortion noise and power efficiency, a deep class-AB bias linear regulator may be used as the linear regulator 651.

In order to increase the operating speed of the linear regulator 651, the current consumption of the drive stage in the linear regulator 651 may increase. In addition, since the crossover distortion noise of the linear regulator 651 that performs sourcing and sinking increases along with an increase in the bandwidth of the signal increases, the bias of the linear regulator 651 should be increased to solve this problem. At this time, when the bias of the linear regulator 651 increases, the magnitude of the pass current also increases, so that power efficiency of the ET modulator 650 may be lowered.

Even in the case where the linear regulator 651 is configured with a fixed bias as described above, in a network environment having a low maximum bandwidth (e.g., 20 MHz for LTE), there is no significant problem in tracking the envelope signal by the ET modulator 650. However, in a network environment having a high maximum bandwidth (e.g., 100 MHz for NR), the operating speed of the linear regulator 651 must be increased and for this, the consumption current and bias (or pass current $I_{shoot-through}$) of the drive stage of the linear regulator 651 are also required to be increased. In this case, when the current consumption is increased in consideration of the maximum bandwidth, in a low-band signal that is frequently used in a real network environment, or a partial resource block (RB) of 4G (or LTE) communication that uses only some of allocable RBs, or an inner RB of 5G (or NR) communication, the current may be unnecessarily consumed.

In addition, in FIG. 6A, the switching converter 652 may use a fixed switching frequency.

The switching converter 652 may generate the switch current $I_{switch}$ with high efficiency through a switching operation using a DC-DC converter. One important factor that determines the efficiency of the DC-DC converter is the switching frequency. When the switching frequency increases, a ripple decreases, but a switching loss increases, resulting in lower efficiency. Conversely, when the switching frequency decreases, the efficiency increases and the ripple increases. Therefore, it is necessary to maintain the switching frequency optimized according to an input envelope signal.

Even when the switching converter 652 operates at a fixed switching frequency as described above, in the network environment having a low maximum bandwidth (e.g., 20 MHz for LTE), there may be no problem in the efficiency. However, in the network environment having a high maximum bandwidth (e.g., 100 MHz for NR), a dynamic range of an envelope signal bandwidth to be amplified increases, so that the operation of the switching converter 652 at the fixed switching frequency may have limitations in efficiency optimization.

Figure 7:
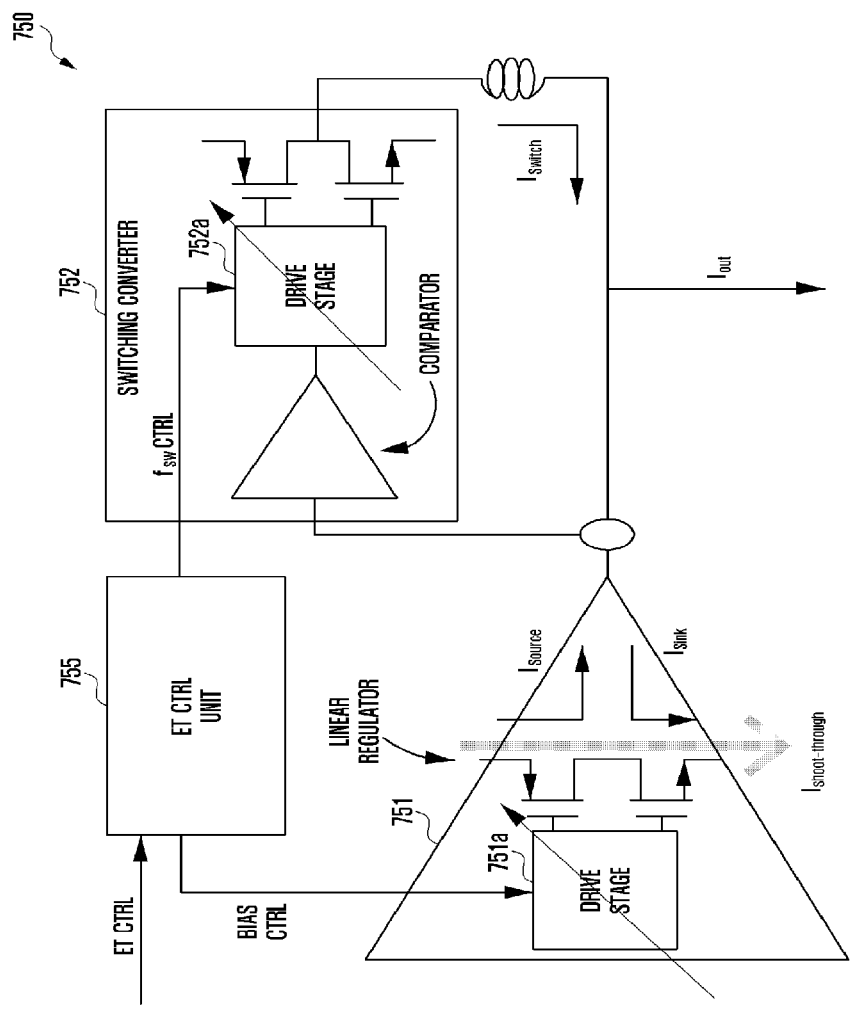
FIG. 7 is a block diagram illustrating an ET modulator that performs ET according to a network environment, according to an embodiment.

FIG. 7 is a block diagram illustrating an ET modulator that performs envelope tracking according to a network environment, according to an embodiment.

Figure 8:
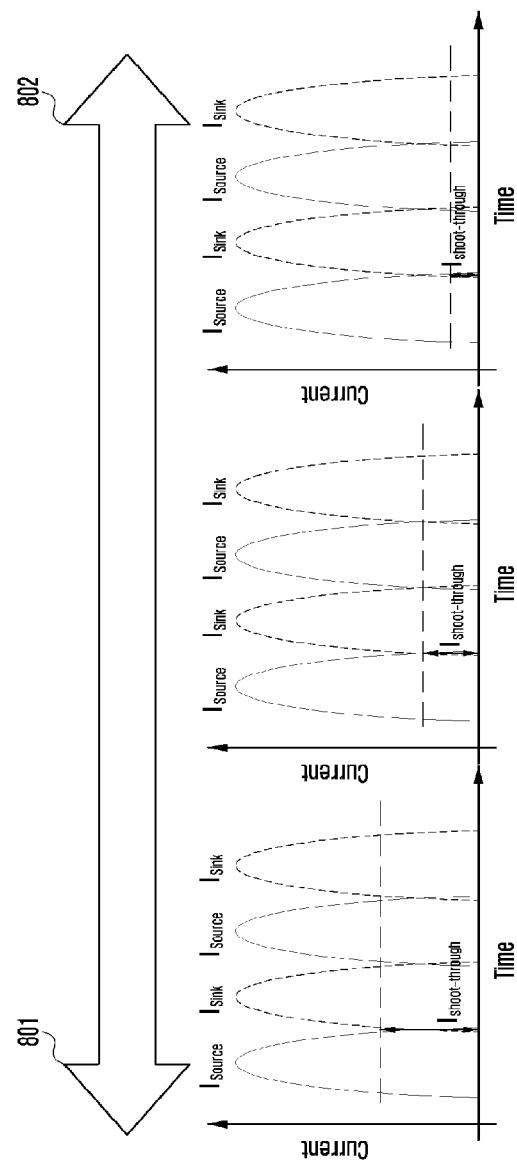
FIG. 8 is a graph illustrating a bias and a pass current according to a signal bandwidth in an ET modulator that performs ET according to a network environment, according to an embodiment.

FIG. 8 is a graph illustrating a bias and a pass current according to a signal bandwidth, according to an embodiment.

The ET modulator 650 of FIGS. 6A and 6B includes the linear regulator 651 of the fixed bias and the switching converter 652 of the fixed switching frequency, resulting in low efficiency. However, the ET modulator 750 of FIG. 7 may control the operations of a linear regulator 751 and a switching converter 752 in consideration of a network environment, and thus higher efficiency may be obtained compared to when the linear regulator 651 of the fixed bias and switching converter 652 of the fixed switching frequency are used.

Referring to FIG. 7, the ET modulator 750 includes the linear regulator 751, the switching converter 752, and an ET control block 755.

The ET control block 755 may obtain network environment information including at least one of a bandwidth, an RB, an SCS, and a modulation scheme from a network monitor 360.

The ET control block 755 may determine the bias of the linear regulator 751 and/or the switching frequency of the switching converter 752 according to the input network environment information.

Referring to FIG. 8, when the bias of the linear regulator 751 is increased (class-A direction 801) and the pass current $I_{shoot-through}$ is increased, the operating speed of the linear regulator 751 may be increased and accordingly envelope tacking may be implemented even in a network of a high bandwidth. Conversely, when the bias of the linear regulator 751 is reduced (class-B direction 802) and the pass current $I_{shoot-through}$ is lowered, the operating speed of the linear regulator 751 may be reduced and power consumption may be reduced.

The ET control block 755 may increase the bias of the linear regulator 751 when performing communication using a high bandwidth (or at least one of an RB, an SCS, or a modulation scheme) based on the network environment information, and may reduce the bias of the linear regulator 751 for the purpose of power efficiency when performing communication with a low bandwidth (or at least one of an RB, an SCS, or a modulation scheme).

The ET modulator 750 may include a bias control circuit that can adjust the bias of the linear regulator 751. The ET control block 755 may drive at least a portion of the bias control circuit based on the network environment information.

The ET control block 755 may store a table obtained by mapping the magnitude of the bias of the linear regulator 751 to be used and/or a portion of the bias control circuit to be driven according to the network environment information (e.g., at least one of a bandwidth, an RB, an SCS, or a modulation scheme), and may perform control using the stored table.

Figure 9:
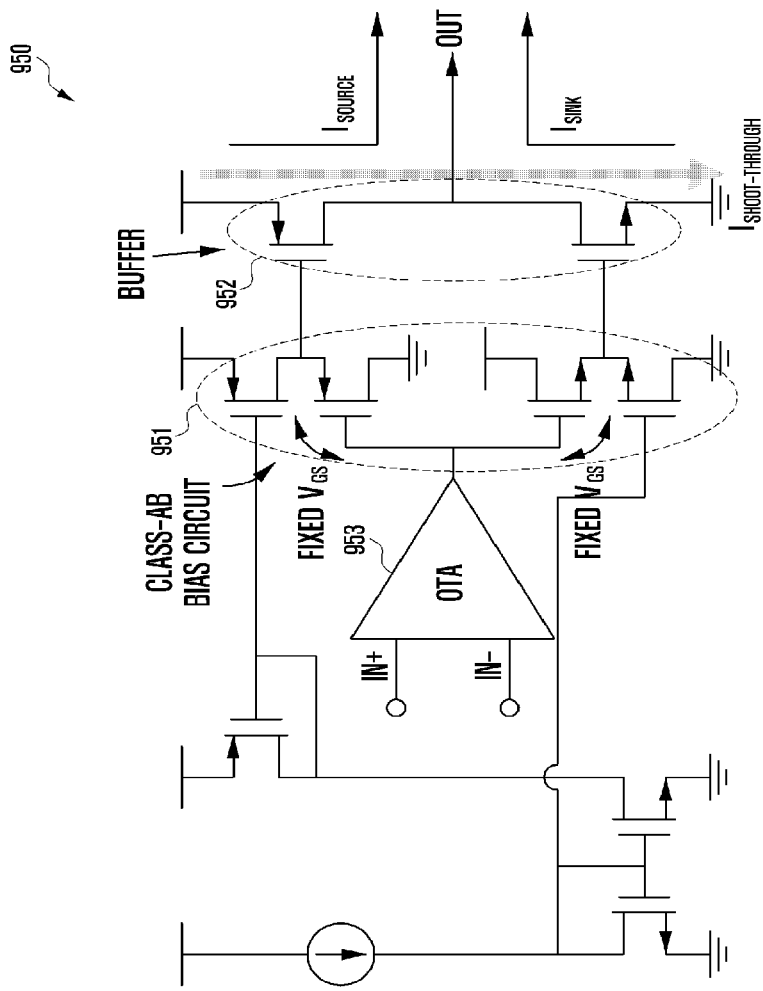
FIG. 9 is a diagram illustrating a structure of a linear regulator of an ET modulator, according to an embodiment.

FIG. 9 is a diagram illustrating a structure of a linear regulator of an ET modulator, according to an embodiment.

FIG. 9 illustrates a case using a fixed bias to a linear regulator 950.

Referring to FIG. 9, the linear regulator 950 includes a class-AB bias circuit 951, a buffer 952, and an operational trans-conductance amplifier (OTA) 953.

The class-AB bias circuit 951 may adjust the bias of output source current $I_{source}$ and sink current $I_{sink}$ to class-AB, so that the linear regulator 950 may operate with high efficiency through lower crossover distortion noise.

A buffer 952 may be a final stage of the linear regulator 950, and may output the source current $I_{source}$ and the sink current $I_{sink}$ to form an output current $I_{out}$ together with a switching current $I_{switch}$ output from a switching converter 752.

The OTA 953 is an amplifier that outputs an input voltage as an output current in proportion to trans-conductance, and may amplify an applied envelope signal and an output envelope signal in a differential manner. The linear regulator 950 of FIG. 9 may use a fixed current to the class-AB bias circuit 951 through a fixed current mirror. Accordingly, in the class-AB bias circuit 951, a common drain transistor may have the same gate to source voltage (VGS) regardless of the bandwidth of an RF transmission signal, so that the linear regulator 950 may output the source current $I_{source}$ and the sink current $I_{sink}$ according to the fixed bias.

Figure 10:
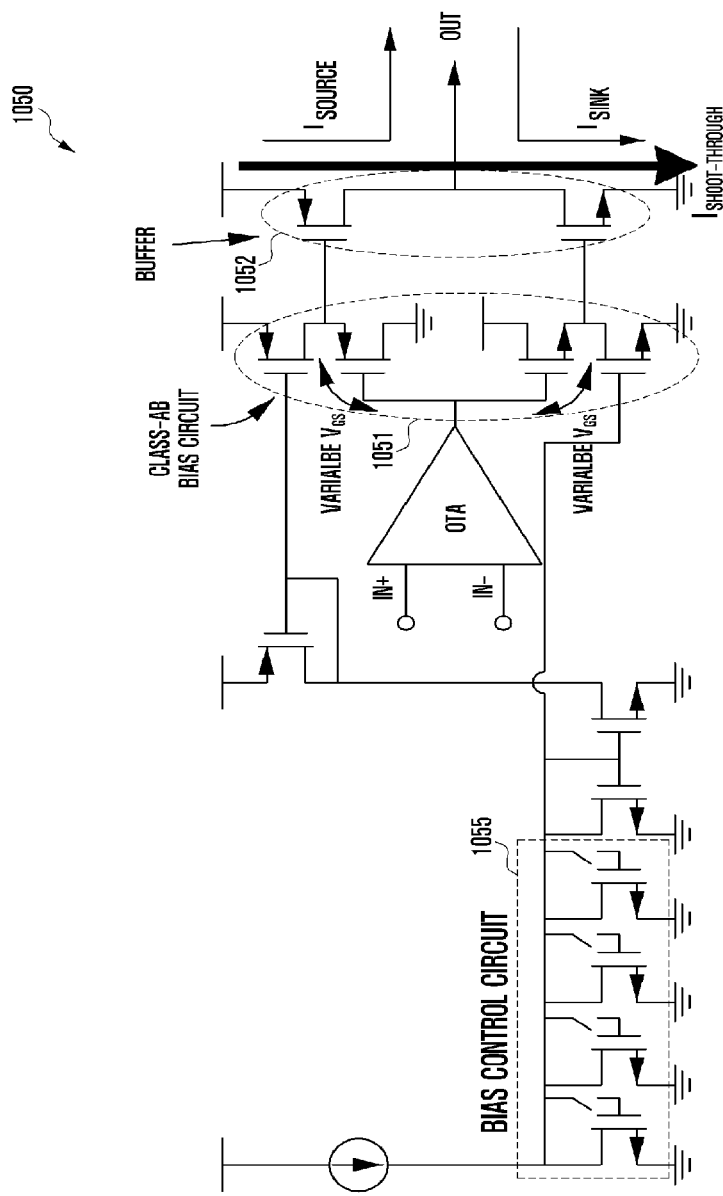
FIG. 10 is a diagram illustrating a structure of a linear regulator of an ET modulator that performs envelope tracking according to a network environment, according to an embodiment.

FIG. 10 is a diagram illustrating a structure of a linear regulator of an ET modulator that performs ET according to a network environment, according to an embodiment.

FIG. 10 shows a case using a variable bias to a linear regulator 1050.

Referring to FIG. 10, the linear regulator 1050 includes a bias control circuit 1055 for variably controlling a bias. The bias control circuit 1055 may include a plurality of transistors connected in parallel to each other to be independently switchable.

An ET control block 755 of an ET modulator 750 may obtain network environment information (e.g., at least one of a bandwidth, an RB, an SCS, or a modulation scheme) obtained from a network monitor 360. The ET control block may switch the transistor of the bias control circuit 1055 or adjust the ratio of a current mirror based on the network environment information.

Since a current received through a bandgap reference (BGR) circuit is constant, the current flowing in a class-AB bias circuit 1051 may be adjusted by adjusting the ratio of the current mirror differently. For example, when no current is output from the bias control circuit 1055 to the class-AB bias circuit 1051, the class-AB bias circuit 1051 may generate a bias by a current input from the BGR circuit, and when at least a portion of the bias control circuit 1055 is switched and a current flows to the class-AB bias circuit 1051, the class-AB bias circuit 1051 may generate a higher bias.

The ET control block may control the ratio of the current mirror of the bias control circuit 1055, may accordingly adjust a VGS value of a common drain transistor, and may adjust the bias of the buffer 1052 that generates the source current $I_{source}$ and the sink current $I_{sink}$. Accordingly, the magnitude of the pass current $I_{shoot-through}$ may be determined.

For example, when the bias control circuit 1055 includes at least one switch (e.g., four switches), a thermal code including binary codes corresponding to on/off of each switch may be output. The ET control block may output "0000" as the thermal code when a bandwidth currently used for an RF transmission signal is 20 MHz, and thus the bias control circuit 1055 does not output a current to the class-AB bias circuit 1051, and the bias may be determined by the output current of the BGR circuit. However, when the bandwidth used for the RF transmission signal increases to a higher value, such as 40 MHz, 60 MHz, 80 MHz, or 100 MHz, the BT control block may respectively output "0001", "0011", "0111", or "1111" as the thermal code to the bias control circuit 1055. The transistor of the bias control circuit 1055 may be switched and may be input to the class-AB as in the current of the BGR circuit, and accordingly, a higher bias may be generated in the linear regulator 1050.

A switching converter 752 that generates a DC current of the ET modulator with high efficiency may also adjust a switching frequency for determining the efficiency of a DC-DC converter based on the network environment information (e.g., the bandwidth of the RF transmission signal).

The switching converter may include the same circuit as the bias control circuit 1055 of the linear regulator 1050 of FIG. 10, and the circuit may be controlled according to the control signal of the ET control block. Accordingly, a switching frequency of a drive stage of the switching converter (e.g., a drive stage 752a in FIG. 7) may be adjusted according to the control signal of the ET control block.

Figure 11:
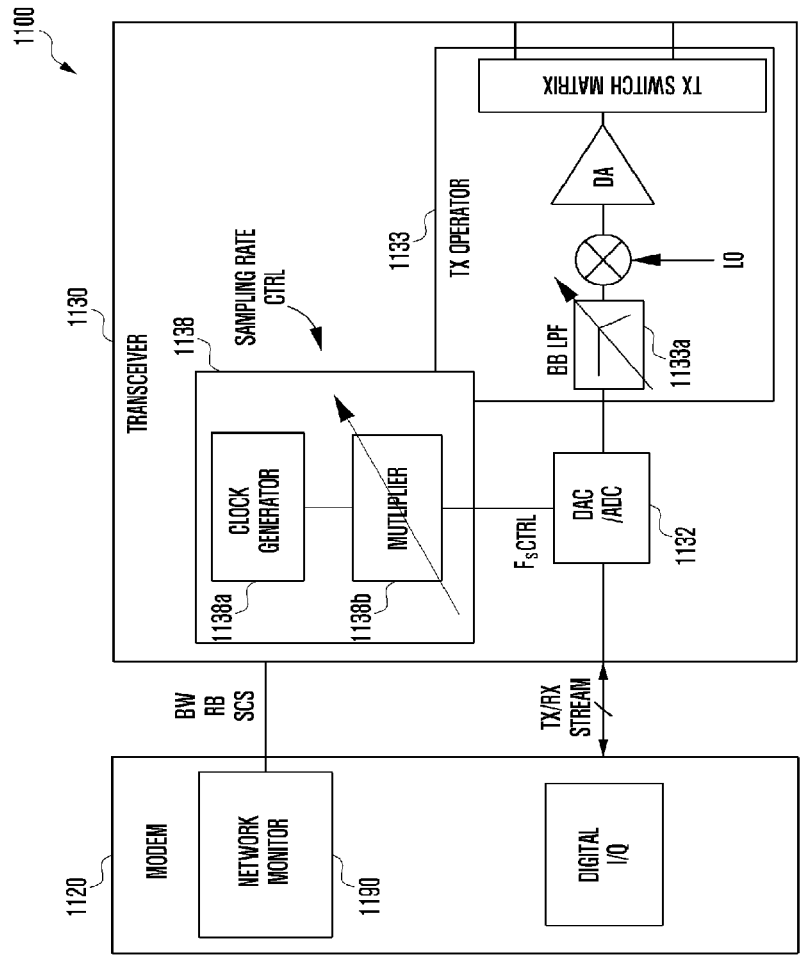
FIG. 11 is a block diagram illustrating a modem and a transceiver for sampling rate control, according to an embodiment.

FIG. 11 is a block diagram illustrating a modem and a transceiver for sampling rate control, according to an embodiment.

Referring to FIG. 11, a wireless communication system 1100 includes a modem 1120 and a transceiver 1130.

An AP 390 may process data to be transmitted to an external device as a digital signal, and an RF signal transmitted through an antenna is an analog signal. Accordingly, the wireless communication system 1100 may perform conversion between digital and analog signals through a DAC/ADC block 1132.

In order to convert the analog signal into the digital signal, sampling, quantization, and coding processes are required. In the sampling process, a sampling rate $f_s$ should be at least twice the bandwidth of a transmission/reception baseband channel according to the Nyquist theory. Here, an interval $T_d$ between sampling points is inversely proportional to the sampling rate $f_s$. Therefore, as the sampling rate $f_s$ increases, the interval $T_d$ between sampling points decreases, thus the corresponding signal can be finely modulated and demodulated, and the signal can be adjusted in a shorter time unit. However, when a clock speed is increased to increase the sampling rate, an increase in current consumption causing heat generation and battery consumption may occur.

A high-performance operation through the increase in the clock speed may have a more important effect in a broadband ET operation. For example, when a sampling rate used in a low-bandwidth wireless communication (e.g. LTE) is used for a broadband wireless communication (e.g. NR), there is a limitation in the delay adjustment between the RF signal and the envelope signal in the ET system, so that characteristics such as output power, efficiency, or linearity may deteriorate. On the other hand, the use of a high sampling rate for broadband wireless communication may cause a waste of current consumption when a low-bandwidth signal is transmitted.

Accordingly, the electronic device may determine the sampling rate optimized for communication quality and current consumption based on the network environment information.

Referring to FIG. 11, the wireless communication system 1100 includes a sampling rate control block 1138 for determining a sampling rate according to the network environment information. The sampling rate control block 1138 may include a clock generator 1138a that generates a clock signal of a specific frequency and a multiplier 1138b that determines a coefficient to be multiplied by the clock signal to determine the sampling rate.

The network monitor 1190 may acquire network environment information including at least one of a bandwidth, an RB, or an SCS, and may provide the acquired information to the sampling rate control block 1138.

The sampling rate control block 1138 may use the network environment information received from the network monitor 1190 to select an optimized coefficient according to the current bandwidth, RB, or SCS through modeling and/or an algorithm of the multiplier 1138b. Accordingly, the sampling rate of the DAC/ADC block 1132 may be adjusted by multiplying the clock signal generated by the clock generator 1138a by the coefficient selected according to the bandwidth, the RB, or the SCS.

When the sampling rate is changed, a BB LPF 1133a of the Tx operator 1133 that rejects an image signal or a harmonic signal may also need to be changed. The sampling rate control block 1138 may adjust a cutoff frequency of the BB LPF 1133a in response to the sampling rate adjusted according to the bandwidth, the RB, or the SCS.

Figure 12A:
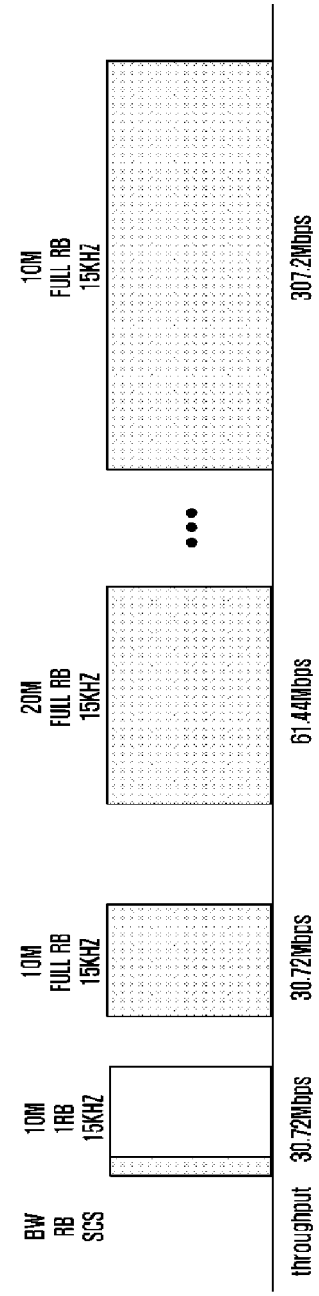
FIG. 12A is a diagram illustrating a method of determining a sampling rate, according to an embodiment.
Figure 12B:
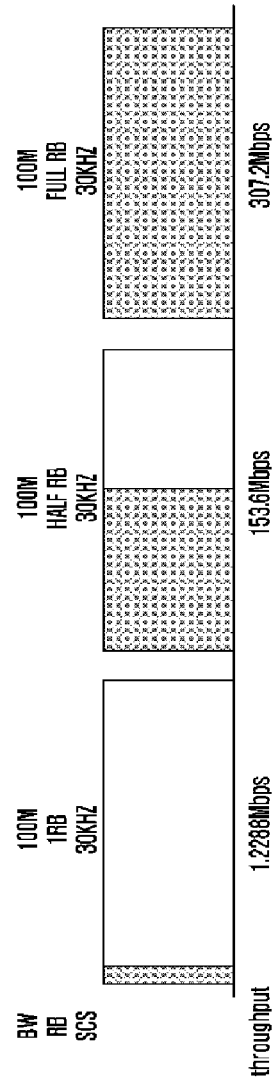
FIG. 12B is a diagram illustrating a method of determining a sampling rate, according to an embodiment.
Figure 12C:
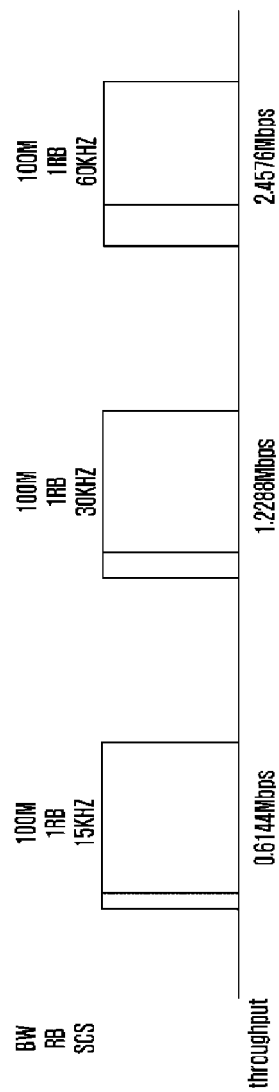
FIG. 12C is a diagram illustrating a method of determining a sampling rate, according to an embodiment.

FIG. 12A is a diagram illustrating a method of determining a sampling rate, according to an embodiment. FIG. 12B is a diagram illustrating a method of determining a sampling rate, according to an embodiment. FIG. 12C is a diagram illustrating a method of determining a sampling rate, according to an embodiment.

FIG. 12A relates to an embodiment of determining a sampling rate only based on a bandwidth.

Referring to FIG. 12A, a sampling rate of 30.72 megabits per second (Mbps) in a 10 MHz bandwidth, a sampling rate of 61.44 Mbps in a 20 MHz bandwidth, and a sampling rate of 307.2 Mbps in a 100 MHz bandwidth may be operated. In this case, since only the bandwidth is considered, the same sampling rate may be operated when only one RB is used in the bandwidth of 10 MHz and when a full RB is used in the same. This may be inefficient because the corresponding operation is performed at the same sampling rate even though the bandwidths required for actual communication are different according to the number of RBs despite the same bandwidth.

FIG. 12B relates to an embodiment of determining a sampling rate based on the resource block.

Referring to FIG. 12B, as to the bandwidth of 100 MHz, when the RB is one RB, a sampling rate of 1.2288 Mbps may be operated, when the resource block is a half RB, a sampling rate of 153.6 Mbps may be operated, and when the resource block is a full RB, a sampling rate of 307.2 Mbps may be operated. Accordingly, even when communication is performed in a network having the same bandwidth, the corresponding operation is performed at a lower sampling rate depending on the number of used RBs, thereby reducing power consumption.

FIG. 12C relates to an embodiment of determining a sampling rate based on an SCS, according to an embodiment.

The wireless communication system may use a variable SCS (e.g., 15/30/60 KHz for NR), and accordingly, the bandwidth of one RB may also be variable. The sampling rate control block may determine the sampling rate according to the used SCS.

Referring to FIG. 12C, when the SCS used at the bandwidth of 100 MHz is 15 KHz, a sampling rate of 0.6144 Mbps may be operated, when the SCS is 30 KHz, a sampling rate of 1.2288 Mbps may be operated, and when the SCS is 60 KHz, a sampling rate of 2.4576 Mbps may be operated.

Figure 13A:
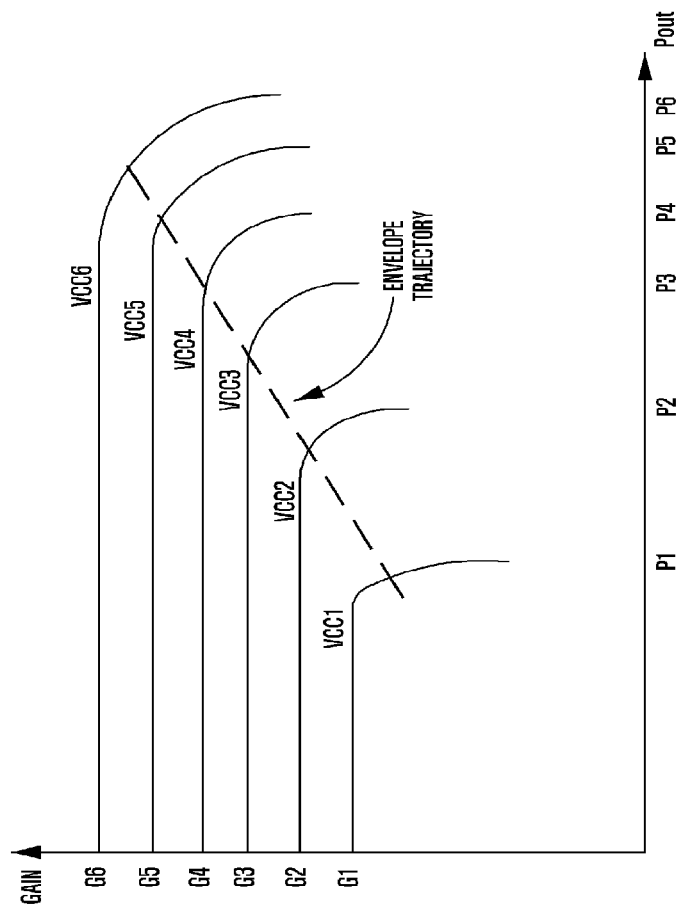
FIG. 13A is a graph illustrating a gain of a power amplifier and an envelope trajectory of an ET system, according to an embodiment.
Figure 13B:
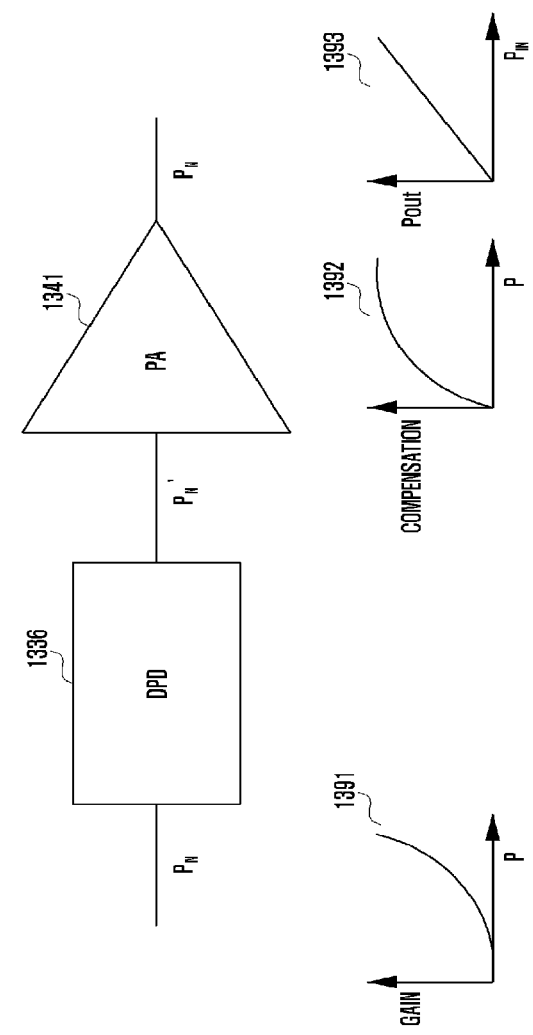
FIG. 13B is a diagram illustrating a method of applying DPD, according to an embodiment.

FIG. 13A is a graph illustrating a gain of a power amplifier and an envelope trajectory of an ET system, according to an embodiment. FIG. 13B is a diagram illustrating a method of applying DPD, according to an embodiment.

When an ET technology is applied, a power amplifier 241 may be operated at a saturation area to optimize the overall efficiency of a system (e.g., the wireless communication system 200 of FIG. 2). When the power amplifier 1341 follows an envelope signal of an RF signal in real time and operates in the saturation area, Vcc may be lowered due to the characteristic of the power amplifier and a gain may decrease, thereby obtaining a compression characteristic as shown in FIG. 13A. The wireless communication system may use DPD to compensate for the gain compression characteristic.

The DPD is a method of pre-distorting an RP input signal applied to the power amplifier by reflecting the gain characteristic of the power amplifier according to the voltage at the common collector (Vcc) based on an envelope trajectory that is actually used. For example, as shown in FIG. 13B, since the power amplifier has a gain characteristic 1391 in the form of a logarithmic function as shown in FIG. 13B, a DPD block 1336 may distort the RF signal in the form of an exponential function 1392 and may input the distorted RF signal to the power amplifier. Accordingly, a signal 1393 amplified by the power amplifier 1341 may have linearity.

Figure 14A:
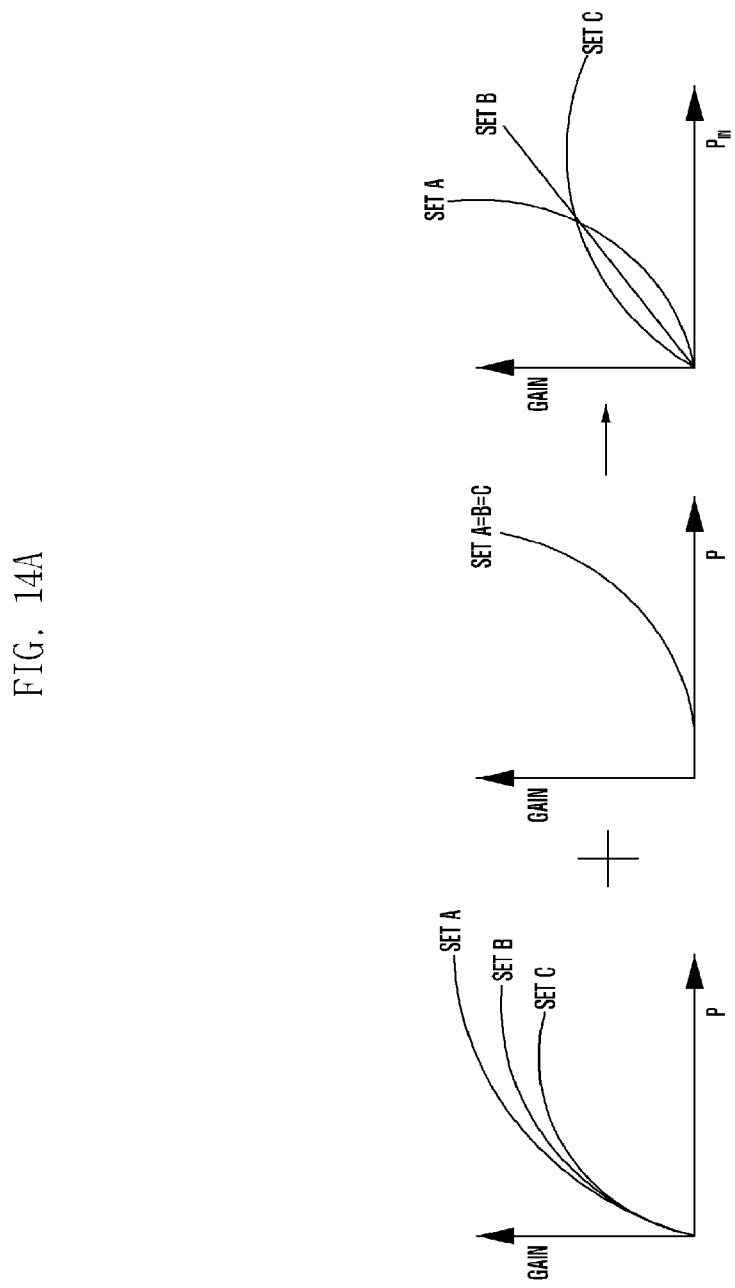
FIG. 14A is a diagram illustrating a method of applying DPD, according to an embodiment.
Figure 14B:
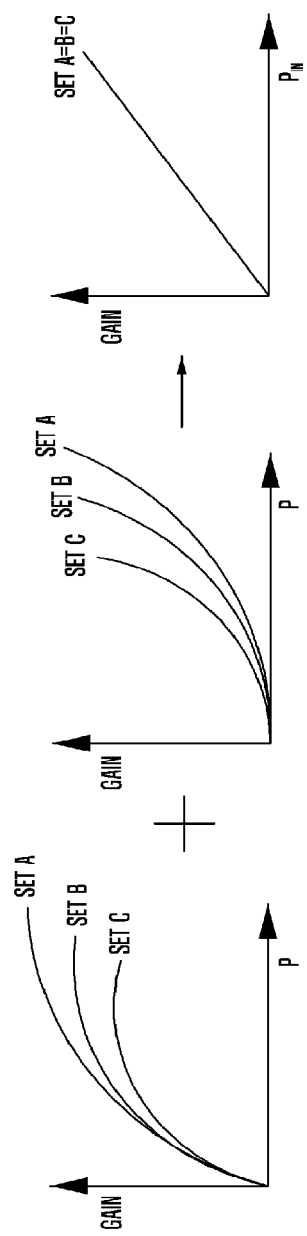
FIG. 14B is a diagram illustrating a method of applying DPD, according to an embodiment.

FIG. 14A is a diagram illustrating a method of applying DPD, according to an embodiment. FIG. 14B is a diagram illustrating a method of applying DPD, according to an embodiment.

The wireless communication system may include a DPD block that pre-compensates for an input signal output from the modem according to the gain compression of the power amplifier. The DPD block may store a DPD LUT capable of compensating for the gain compression. The DPD LUT may be embedded in the DPD block at the time of manufacturing an electronic device (or a wireless communication system).

FIG. 14A shows a case using the same DPD LUT for electronic devices A, B, and C. At this time, even if the electronic devices A, B, and C use the same structure and components, there may be variations in the characteristics of the Tx path between the components. Accordingly, gains for the input power of the power amplifier may be different. In FIG. 14A, the same DPD LUT for electronic devices A, B, and C is used, and thus in some electronic devices, linearity of an output signal by DPD may not be completely compensated.

FIG. 14B shows a case using different DPD LUTs according to the characteristics of the electronic devices A, B, and C. For example, at the time of manufacturing an electronic device, the DPD may be determined by modeling the gain characteristic of the power amplifier for each model. In this case, since the DPD LUT modeled for each of the electronic devices A, B, and C is used as shown in FIG. 14B, the linearity of the output signal may be higher than the case of FIG. 14A.

However, even in the case of FIG. 14B, the determining the DPD for each model of the electronic device may be performed once during calibration in the process and the determined DPD LUT may be embedded in the electronic device of the same model, so that applying an optimized DPD LUT for each various network scenario may be difficult. In addition, linearity may not be obtained by reflecting a change in the Tx characteristic according to the use of the electronic device, and it may be difficult to apply the DPD by determining the DPD LUT in real time by adapting to various RP signals transmitted in different network environments.

Figure 15:
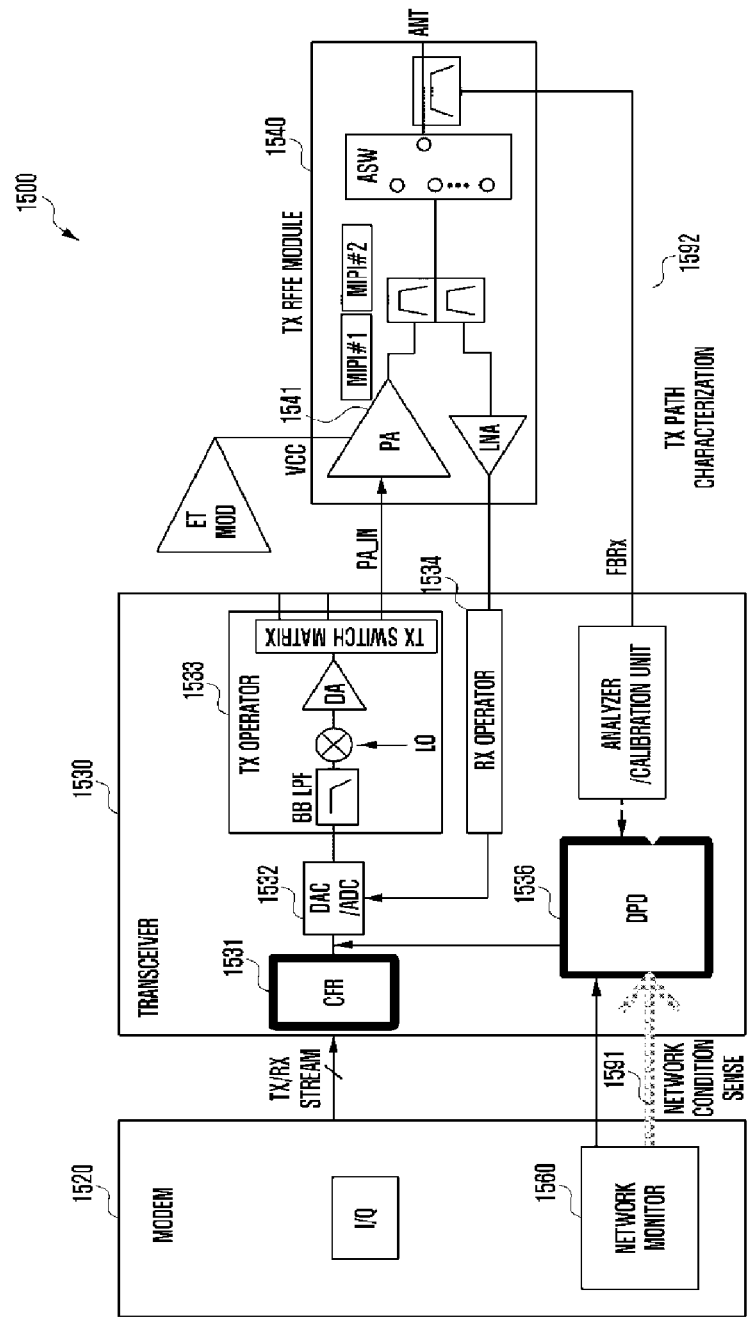
FIG. 15 is a block diagram illustrating a wireless communication system that applies DPD according to a network environment, according to an embodiment.

FIG. 15 is a block diagram illustrating a wireless communication system that applies DPD according to a network environment, according to an embodiment.

A wireless communication system 1500 may include a DPD block 1536 that processes a DPD for an RF signal to be transmitted based on network environment information obtained in real time from a network monitor 1560. The DPD block 1536 may be provided on a transceiver 1530 and may perform DPD before a signal output from a modem 1520 is input to a power amplifier 1541 of a Tx module 1540. For example, the DPD block 1536 may cause a signal which is pre-distorted with respect to a CFR-processed signal in a CFR block 1531 to be input to a DAC/ADC block 1532.

The DPD block 1536 may store a DPD LUT that maps a DPD coefficient to be used to correspond to each network environment (e.g., at least one of a bandwidth, an RB, an SCS, or a modulation scheme).

The network monitor 1560 may check the network environment through operations such as transit antenna selection (TAS) and/or sounding reference signal (SRS) via a Tx operator 1533 and an Rx operator 1534, and may provide network environment information 1591 related to an RP transmission signal to the DPD block 1536. Also, the DPD block 1536 may further acquire characteristic information 1592 of the Tx path through an PBRx path.

The DPD block 1536 may generate an optimized DPD coefficient based on the network environment information 1591 obtained through the network monitor 1560 and characteristic information 1592 of the Tx path obtained through the PBRx path, and may pre-distort the RF transmission signal in real time.

The wireless communication system 1500 may adjust a DPD order according to the network environment, and may update the DPD coefficient in real time, thereby optimizing the performance of the wireless communication system 1500 such as Tx output power, efficiency, error vector magnitude (EVM), or linearity.

A process of performing DPD using the network environment information by the DPD block 1536 may be based on Equations (1) to (3), below.

$$a_n = f(Tx\ \text{chain}) \quad \text{Equation (1)}$$

In Equation (1), $a_n$ may denote a DPD coefficient, and a Tx chain may denote gain compression from the transceiver 1530 to an antenna port of the Tx module 1540.

$$X(t)' = f(X(t)) = a_0 + a_1 X(t) + a_2 X(t)^2 + a_3 X(t)^3 \ldots + a_n X(t)^n \quad \text{Equation (2)}$$

In Equation (2), $X(t)$ may denote an input RF transmission signal, and $X(t)'$ may denote a pre-distorted RF transmission signal.

$$a_n = f(Tx\ \text{chain}, BW, RB, MCS, SCS) \quad \text{Equation (3)}$$

In Equation (3), BW may denote a bandwidth of an RF transmission signal being used, RB may denote a resource block allocated to the RF transmission signal, MCS may denote a modulation coding scheme, and SCS may denote a sub-carrier spacing.

Figure 16:
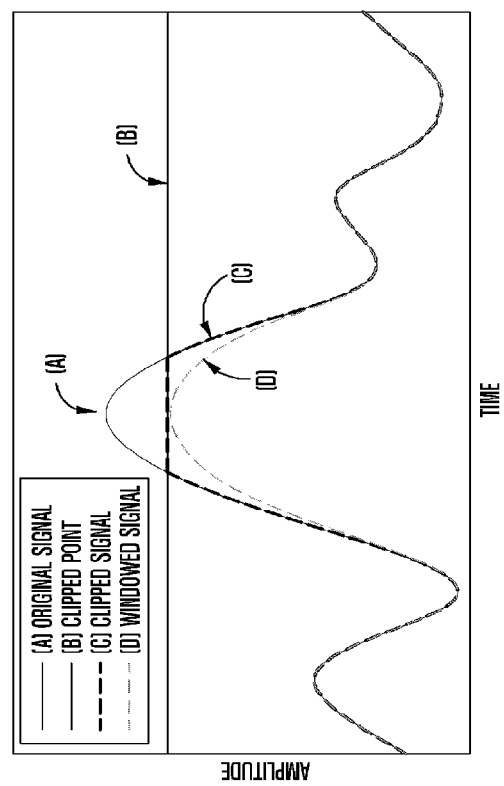
FIG. 16 is a diagram illustrating an example of signals clipped through CFR, according to an embodiment.

FIG. 16 is a diagram illustrating an example of signals clipped through CFR, according to an embodiment.

A transceiver 1530 of a wireless communication system 1500 may use a CFR block 1531 to process CFR of a transmission signal.

A CFR technology is a technology that is used to reduce a PAPR of a transmission signal so that a power amplifier 1541 of a Tx module 1540 that uses a large amount of power consumption in a wireless communication system of an electronic device can operate with a high efficiency. The CFR technology may be implemented through various algorithms, and a representative algorithm will be described below among the various algorithms, but the operation of a CFR block 1531 described in this application is not limited to the algorithm described below.

The CFR may be applied through performing hard clipping and applying a LPF on an input signal. Referring to FIG. 16, a portion exceeding a clipped point in the input signal may be fixed at a specific amplitude ($A_{max}$), and a portion lower than the clipped point may be kept in the same manner as in the original signal. This can be applied through Equations (4.1) and (4.2), below.

$$X_{clip}[n] = c[n] * X[n] \quad \text{Equation (4.1)}$$

$$C[n] = X_{max}/|X[n]|, |X[n]| > X_{max}$$

$$1, |X[n]| > X_{max} \quad \text{Equation (4.2)}$$

In Equations (4.1) and (4.2), $X[n]$ may denote an input signal, $X_{clip}[n]$ may denote a clipped signal, $c[n]$ may denote a clipping coefficient, and $X_{max}$ may denote a clipped point.

Referring to FIG. 16, a sharp edge may be generated in a clipped signal C obtained by performing hard clipping on an input signal A through a clipped point B, which may be a high frequency component of the signal. High-frequency components may cause adjacent channel power (ACP). In order to reduce this unwanted ACP, the clipped signal C may be passed through an LPF to reduce the high-frequency signal corresponding to the sharp edge, and a windowed signal D may be generated.

Here, a windowing method performs filtering with a weighting coefficient $p[n]$ and a window function $w[n]$ to remove the high-frequency component of the clipped signal. The windowing method may be expressed by Equation (5), below.

$$c'[n] = 1 - p[n] * w[n] \quad \text{Equation (5)}$$

In Equation (5), $p[n]$ may denote a weighting coefficient, and $w[n]$ may denote a common window function such as a Gaussian function.

As described above, main parameters to be considered in the CFR technology are a target PAPR, a maximum order of LPF, a pass frequency, a stoppage frequency, a pass ripple, and/or a stoppage ripple.

The required specifications for QPSK/16-QAM/64-QAM/256-QAM in an LTE system have been established, but the usage frequency for 64-QAM and 256-QAM, which are actual high order modulation, may not be large. However, for more efficient data spectrum use and maximum data transmission speed, various signals can be actively used, including 64-QAM and 256-QAM which are high-order modulation.

An error vector magnitude (EVM) specification according to a modulation scheme of a transmission signal is exemplified in Table 1, below.

TABLE 1

| Modulation | Unit | Average EVM Level |
|---|---|---|
| QPSK | % | 17.5 |
| 16QAM | % | 12.5 |
| 64QAM | % | 8 |
| 256QAM | % | 3.5 |

A high-order modulation signal may require a high quality signal because demodulation is complex. Therefore, the Average EVM Level may vary from that which is shown in Table 1.

In the case of using the CFR technology in a wireless communication system, the power amplifier may be operated with high power and/or high efficiency, but EVM characteristics may deteriorate because the original signal is modified. In the case of a signal using low-order modulation (e.g. QPSK or 16-QAM), CFR may be processed by hard clipping because some high-frequency components are allowed. However, when using high-order modulation such as 256-QAM as in a 5G NR network environment, it may be difficult to apply hard clipping because a strict EVM specification is required. In addition, when the wireless communication system uniformly applies soft clipping due to the EVM specification of the high-order modulation signal, the PAPR cannot be sufficiently low at the time of using the low-order modulation, so that the high output of the power amplifier that finally amplifies the RF transmission signal may cause a problem of low coverage in a real network environment.

The CFR block of the wireless communication system may check a modulation scheme used for the RF transmission signal and may perform CFR with a corresponding clipping level. The CFR block may determine a clipping level applied to the CFR based on the network environment information. The CFR block may acquire information related to the modulation scheme currently being used for the RF transmission signal in real time or periodically from a network monitor 1500.

Accordingly, if CFR is performed using the same clipping coefficient regardless of the modulation scheme in a conventional CFR algorithm, the wireless communication system may determine the clipping level by the modulation scheme in real time.

The CFR algorithm may be performed as shown in Equations (6) to (8), below.

$$X_{max}'[n]=f(MCS) \qquad \text{Equation (6)}$$

In Equation (6), $X_{max}'[n]$ may be a clipped point determined in consideration of the modulation scheme, which can be calculated as a function of a modulation coding scheme (MCS).

$$c'[n]=1-p[n]*w[n] \qquad \text{Equation (7)}$$

In Equation (7), p[n] may denote a weighting coefficient, and w[n] may denote a common window function such as a Gaussian function.

$$p[n]=f(MCS) \qquad \text{Equation (8)}$$

In Equation (8), the weighting coefficient p[n] can be calculated as a function of MCS.

Figure 17:
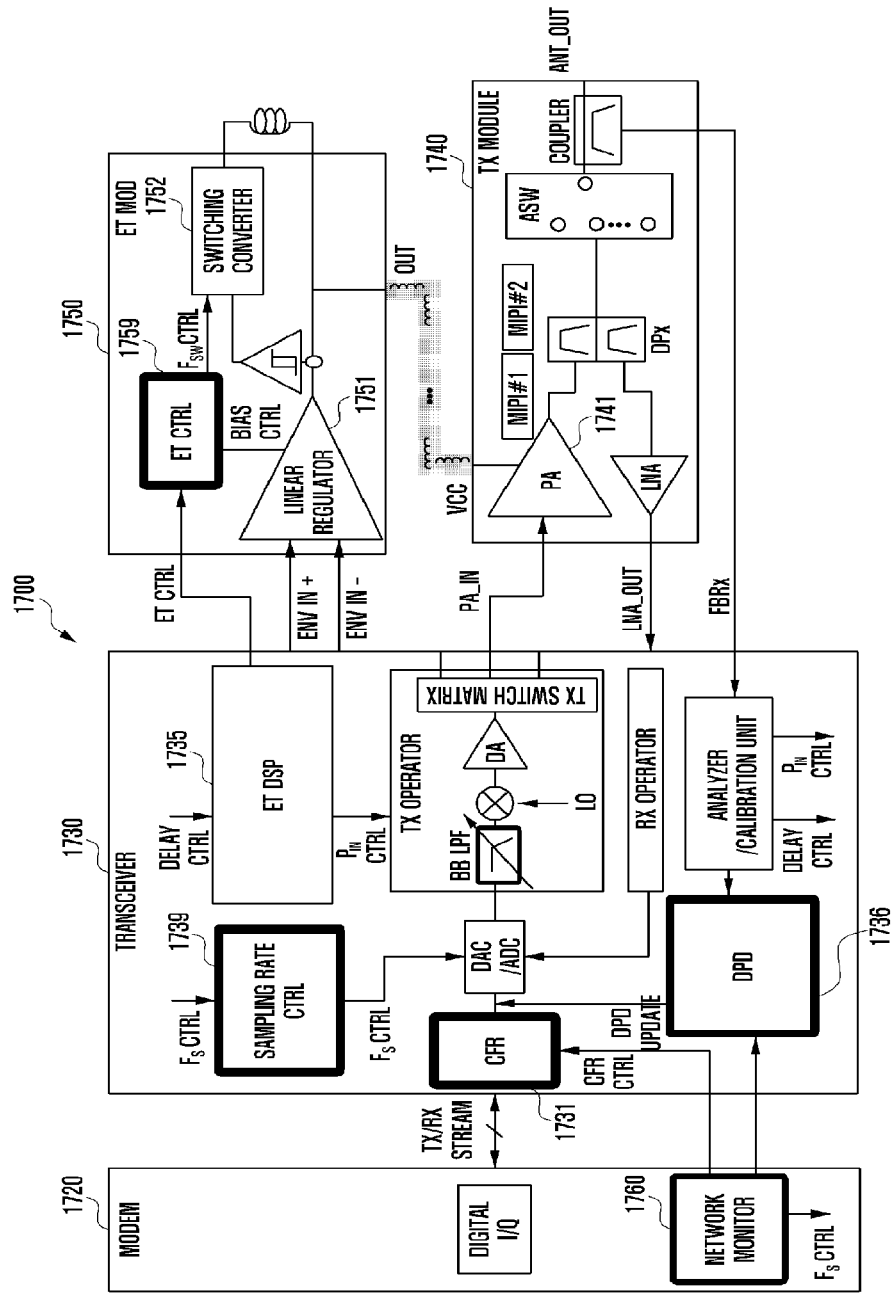
FIG. 17 is a block diagram illustrating a wireless communication system that controls various parameters according to a network environment, according to an embodiment.

FIG. 17 is a block diagram illustrating a wireless communication system 1700 that controls various parameters according to a network environment, according to an embodiment.

FIG. 17 may include the components of the wireless communication system 200 of FIG. 2, and may acquire, when compared to FIG. 2, network environment information using a network monitor 1760 and may perform at least one of, for example, controlling the ET modulator 1750, adjusting a sampling rate, adjusting a DPD order and applying a DPD coefficient in real time, or determining clipping of CPR based on the acquired network environment information.

Hereinafter, in order to avoid redundant descriptions, the technical features described with reference to FIGS. 1 to 16 will be omitted.

Referring to FIG. 17, the network monitor 1760 may check a network environment while a wireless communication system performs wireless communication with an external device (e.g., a base station). When the electronic device is turned on or according to a predetermined period, an AP may allow the network monitor 1760 to check the network environment and to provide the checked information to the AP and/or the wireless communication system (e.g., the CFR block 1731, the DPD block 1736, the sampling rate control block 1739 and the ET control block 1759). The network monitor 1760 may check the network environment information through an FBRx path and/or an Rx chain. The network monitor 1760 may be configured as an independent block, but may be provided on the modem 1720 or the AP 390.

The network environment information may include at least one of a bandwidth, an RB, an SCS, or a modulation scheme.

The ET control block 1759 may adjust a drive stage in the linear regulator 1751 of the ET modulator 1750 based on the network environment information to determine a bias and a pass current $I_{shoot-through}$. A method of controlling the drive stage of the linear regulator 1751 and/or the switching converter 1752 by the ET control block 1759 based on the network environment information and the circuit configuration therefor have been previously described with reference to FIGS. 9 to 10.

The sampling rate control block 1739 may determine a sampling rate according to the network environment information. The sampling rate control block 1739 may receive at least one piece of information related to the current bandwidth, RB, or SCS from the network monitor 1760, and may determine the sampling rate to be used for sampling an RF transmission signal.

The sampling rate control block 1739 may select a coefficient optimized according to the at least one of the current bandwidth, RB, or SCS through modeling and/or an algorithm of the multiplier. Accordingly, the sampling rate of the DAC/ADC may be adjusted by multiplying a clock signal generated by the clock generator by the coefficient selected according to the bandwidth, the RB, or the SCS. The method of controlling the sampling rate based on the network environment information by the sampling rate control block 1739 and the circuit configuration therefor have been previously described with reference to FIGS. 11 to 12.

The DPD block 1736 may process a DPD for an RP signal to be transmitted based on the network environment information acquired in real time. The DPD block 1736 may be provided on the transceiver 1730, and may perform DPD before a signal output from the modem 1720 is input to the power amplifier 1741 of the Tx module 1740. The DPD block 1736 may store a DPD LUT mapping a DPD coefficient to be used in correspondence with each network environment (e.g., at least one of the bandwidth, the RB, the SCS, or the modulation scheme). The method of performing DPD based on the network environment information by the DPD block 1736 and the circuit configuration therefor have been previously described with reference to FIGS. 13 to 15.

The CFR block 1731 may check the modulation scheme used for the RF transmission signal based on the network environment information received from the network monitor 1760, and may perform CFR with a corresponding clipping level. A method of performing CFR based on the modulation scheme by the DPD block 1736 has been previously described with reference to FIG. 16.

Various embodiments of the application may include at least some of the components of FIG. 17. For example, the electronic device may include at least some of the CFR block 1173, the DPD block 1736, the sampling rate control block 1739, and the ET control block 1759, which perform determined processing by adapting to the network environment. Alternatively, some of the blocks may operate using fixed parameters without using the network environment information.

According to an embodiment, an electronic device may include a network monitor configured to acquire network environment information related to an RF transmission signal; a transceiver configured to generate an envelope signal of the RF transmission signal; a Tx module including a power amplifier for receiving the RF transmission signal from the transceiver and amplifying the RF transmission signal; and an ET modulator configured to receive the envelope signal from the transceiver and to provide a bias of the power amplifier to correspond to the envelope signal, wherein the ET modulator may determine a magnitude of the bias of the power amplifier based on the network environment information acquired by the network monitor.

The ET modulator may include a linear regulator configured to linearly amplify the envelope signal and the switching converter configured to output a switching current according to a switching frequency, and the ET modulator may output an output current to the Tx module, wherein the output current is obtained by mixing a pass current output from the linear regulator with the switching current.

The ET modulator may further include an ET control block configured to determine a magnitude of the pass current output from the linear regulator based on the network environment information.

The ET control block may control the magnitude of the pass current to be increased when the RF transmission signal is a high-bandwidth signal based on the network environment information.

The liner regulator may include a bias control circuit configured to include a plurality of transistors that can be switched according to a control signal of the ET control block, and the ET control block may control a magnitude of a current that is input as a bias of the linear regulator from the bias control circuit based on the network environment information.

The ET control block may determine the switching frequency of the switching converter based on the network environment information.

The electronic device may further include a DAC configured to convert a digital signal into an analog signal and the sampling rate control block configured to determine a sampling rate of the DAC based on the network environment information.

The sampling rate control block may determine the sampling rate by multiplying a clock signal generated by the clock generator with a coefficient selected according to the network environment information.

The electronic device may further include the DPD block configured to output a linearized signal by pre-distorting the RF transmission signal according to a gain characteristic of the power amplifier, and the DPD block may distort the RF transmission signal using a DPD coefficient corresponding to the network environment information.

The electronic device may further include the CFR block configured to reduce a PAPR of the RF transmission signal by clipping at least a portion of the RF transmission signal, and the CFR block may determine a clipping level for applying the CFR based on the network environment information.

The network environment information may include at least one of a bandwidth, an RB, an SCS, or a modulation scheme.

The network monitor may acquire the network environment information related to the RF transmission signal through at least one of an FBRx path and an Rx path.

The network monitor may acquire the network environment information when the electronic device is powered on or for each predetermined period.

The electronic device may further include the modem configured to transmit a digital baseband signal to the transceiver, and the network monitor 1760 may be included in the modem.

The electronic device may output the RF transmission signal according to a 5G NR communication scheme.

Figure 18:
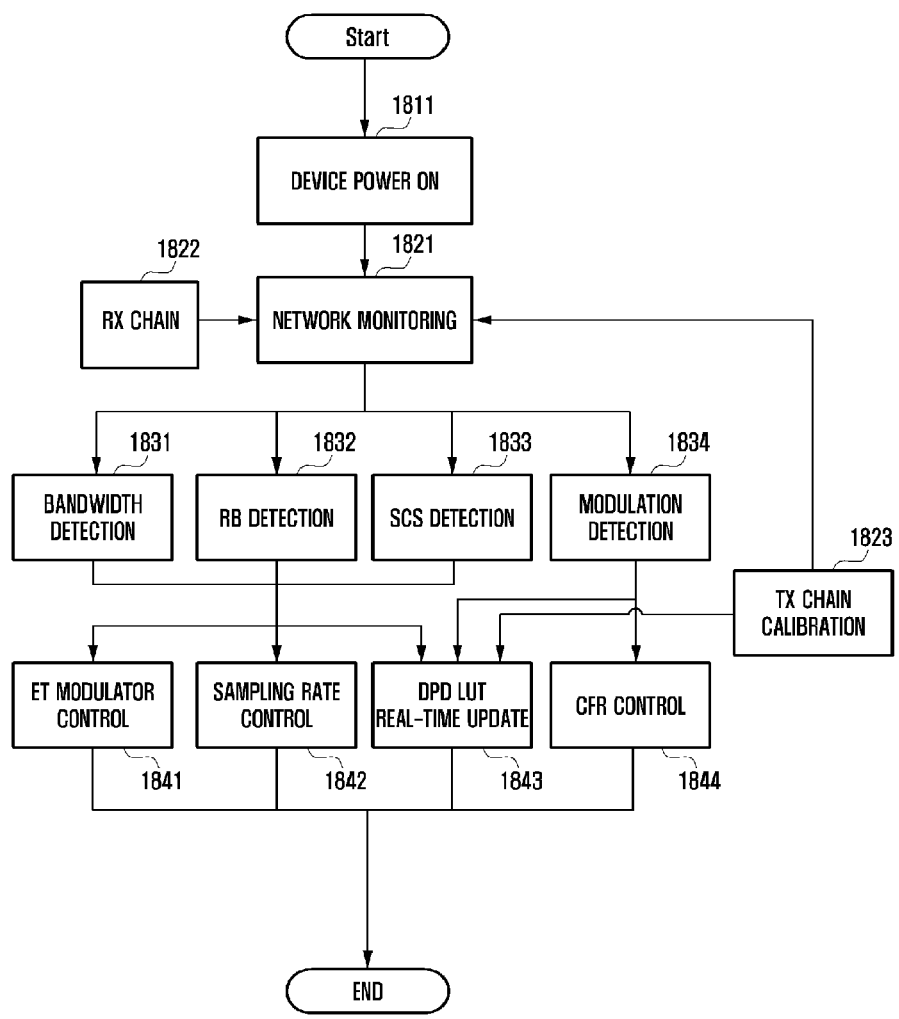
FIG. 18 is a flowchart illustrating a method of operating a wireless communication system, according to an embodiment.

FIG. 18 is a flowchart illustrating a method of operating a wireless communication system, according to an embodiment.

The illustrated method may be performed by the electronic device (or the wireless communication system) described with reference to FIGS. 1 to 17 above, and the description of the technical features described above will be omitted below.

In step 1811, an electronic device 300 is powered on. After the electronic device 300 is powered on in step 1811, the electronic device monitors network environment information using a network monitor 360 in step 1821.

The network monitor 360 may monitor the network environment information in step 1821 by performing Tx chain calibration in step 1823 and/or by performing Rx chain calibration in step 1822. The network environment information may include at least one of a bandwidth detected in step 1831, an RB detected in step 1832, an SCS detected in step 1833, or a modulation scheme detected in step 1834.

In step 1841, an ET control block 755 controls a drive stage of a linear regulator 751 and/or a switching converter 752 of the ET modulator 750 based on at least one of the detected bandwidth, RB, or SOS information.

In step 1842, a sampling rate control block 1138 determines a sampling rate based on the at least one of the detected bandwidth, RB, or SCS information. For example, the sampling rate control block 1138 may adjust a sampling frequency of a multiplier 1138b in the sampling rate control block 1138 and a cutoff frequency of a BB LBF 1133a to remove image/harmonic signals.

In step 1843, a DPD block 1336 receives the bandwidth, the RB, the SCS information and the modulation scheme information obtained from the network monitor and a characteristic of a transmitted Tx signal through the FBRx, and determines and updates a DPD LUT in real time.

A DPD order may be embedded in a DPD LUT determination model to adjust a used order according to the type of signal. The DPD coefficient may characterize the Tx path based on the FBRx information detected in real time and may determine an optimized DPD coefficient by using the DPD order that matches the type of the signal.

In step 1844, a CFR block 1173 adjusts a clipping level by adjusting a clipping point and a weighting coefficient p[n] according to a modulation scheme of a transmitted signal.

According to an embodiment, a control method of a wireless communication system of an electronic device may include acquiring network environment information related to an RF transmission signal; generating an envelope signal of the RP transmission signal; and providing a bias of a power amplifier for amplifying the RF transmission signal to correspond to the envelope signal, wherein providing the bias may include determining a magnitude of the bias of the power amplifier based on the network environment information.

Determining the magnitude of the bias may include at least one of determining a magnitude of a pass current output from a linear regulator for linearly amplifying the envelope signal based on the network environment information and determining a switching frequency of the switching converter for outputting a switching current according to the switching frequency based on the network environment information.

Determining the magnitude of the pass current may include increasing the magnitude of the pass current when the RF transmission signal is a high bandwidth-signal.

The network environment information may include at least one of a bandwidth, an RB, an SCS, or a modulation scheme.

Acquiring the network environment information may include acquiring the network environment information related to the RF transmission signal through at least one of an FBRx path and an Rx path.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
   a network monitor configured to acquire network environment information related to a radio frequency (RF) transmission signal;
   a transceiver configured to generate an envelope signal of the RF transmission signal;
   a digital to analog converter (DAC) configured to convert a digital signal into an analog signal;
   a sampling rate control block configured to determine a sampling rate of the DAC based on the network environment information;
   a transmission (Tx) module including a power amplifier for receiving the RF transmission signal from the transceiver and amplifying the RF transmission signal; and
   an envelope tracking (ET) modulator configured to receive the envelope signal from the transceiver and to provide an input power of the power amplifier to correspond to the envelope signal, the ET modulator comprising a linear regulator configured to linearly amplify the envelope signal and a switching converter configured to output a switching current according to a switching frequency,
   wherein the ET modulator is further configured to determine a magnitude of the input power provided to the power amplifier based on the network environment information acquired by the network monitor,
   wherein the ET modulator is further configured to regulate a bias of the linear regulator and the switching frequency of the switching converter based on the network environment information, and
   wherein the network environment information comprises at least one of a bandwidth, a resource block, a sub-carrier spacing, and a modulation scheme.

2. The electronic device of claim 1, wherein the ET modulator is further configured to an output current to the Tx module, and
   wherein the output current is obtained by mixing a pass current output from the linear regulator with the switching current.

3. The electronic device of claim 2, wherein the ET modulator further comprises an ET control block configured to determine a magnitude of the pass current output from the linear regulator based on the network environment information, and
   the ET control block is further configured to control the magnitude of the pass current to be increased when the RF transmission signal is a high-bandwidth signal based on the network environment information.

4. The electronic device of claim 3, wherein the linear regulator comprises a bias control circuit including a plurality of transistors configured to be switched according to a control signal of the ET control block, and
   the ET control block is further configured to control a magnitude of a current that is input as a bias of the linear regulator from the bias control circuit based on the network environment information.

5. The electronic device of claim 1, wherein the sampling rate control block determines the sampling rate by multiplying a clock signal generated by a clock generator by a coefficient selected according to the network environment information.

6. The electronic device of claim 1, further comprising:
   a digital pre-distortion (DPD) block configured to output a linearized signal by pre-distorting the RF transmission signal according to a gain characteristic of the power amplifier,
   wherein the DPD block is further configured to distort the RF transmission signal using a DPD coefficient corresponding to the network environment information.

7. The electronic device of claim 1, further comprising:
   a crest factor reduction (CFR) block configured to reduce a peak to average power ratio (PAPR) of the RF transmission signal by clipping at least a portion of the RF transmission signal,
   wherein the CFR block is further configured to determine a clipping level applied to the CFR based on the network environment information.

8. The electronic device of claim 1, wherein the network monitor acquires the network environment information related to the RF transmission signal through at least one of a feedback (FB) reception (Rx) (FBRx) path and an Rx path.

9. The electronic device of claim 1, further comprising:
   a modem configured to transmit a digital baseband signal to the transceiver,
   wherein the network monitor is included in the modem.

10. The electronic device of claim 1, wherein the network monitor is further configured to acquire the network environment information related to the RF transmission signal through at least one of a feedback (FB) reception (Rx) (FBRx) path and an Rx path.

11. The electronic device of claim 1, wherein the network monitor is further configured to acquire the network environment information when the electronic device is powered on or for each predetermined period.

12. The electronic device of claim 1, further comprising:
a modem configured to transmit a digital baseband signal to the transceiver,
wherein the network monitor is included in the modem.

13. The electronic device of claim 1, wherein the electronic device outputs the RF transmission signal according to a fifth generation (5G) new radio (NR) communication scheme.

14. A control method of a wireless communication system of an electronic device, the control method comprising:
acquiring network environment information related to a radio frequency (RF) transmission signal;
generating an envelope signal of the RF transmission signal; and
providing an input power of a power amplifier for amplifying the RF transmission signal to correspond to the envelope signal,
wherein the providing the input power comprises determining a magnitude of the input power of the power amplifier based on the network environment information,
wherein the providing the input power comprises regulating a bias of a linear regulator and a switching frequency of a switching converter based on the network environment information,
wherein the generating the envelope signal comprises converting a digital signal into an analog signal and determining a sampling rate of converting the digital signal to the analog signal based on the network environment information, and
wherein the network environment information comprises at least one of a bandwidth, a resource block, a subcarrier spacing, a modulation scheme.

15. The control method of claim 14, wherein the determining the magnitude of the input power comprises at least one of:
determining a magnitude of a pass current output from the linear regulator for linearly amplifying the envelope signal based on the network environment information, and
determining the switching frequency of the switching converter for outputting a switching current according to the switching frequency based on the network environment information.

16. The control method of claim 15, wherein the determining the magnitude of the pass current comprises increasing the magnitude of the pass current when the RF transmission signal is a high bandwidth-signal.

17. The control method of claim 15, wherein the determining the sampling rate multiplies a clock signal generated by a clock generator by a coefficient selected according to the network environment information for determining the sampling rate.

18. The control method of claim 14, further comprising:
distorting the RF transmission signal using a digital pre-distortion (DPD) coefficient corresponding to the network environment information; and
outputting a linearized signal by pre-distorting the RF transmission signal according to a gain characteristic of the power amplifier.

19. The control method of claim 14, further comprising:
determining a clipping level based on the network environment information; and
reducing a peak to average power ratio (PAPR) of the RF transmission signal by clipping at least a portion of the RF transmission signal based on the clipping level.

20. The control method of claim 14, wherein the acquiring the network environment information comprises acquiring the network environment information related to the RF transmission signal through at least one of an feedback (FB) reception (Rx) (FBRx) path and an Rx path.

* * * * *